(12) United States Patent
Lee et al.

(10) Patent No.: US 9,508,730 B2
(45) Date of Patent: Nov. 29, 2016

(54) SEMICONDUCTOR DEVICE AND MANUFACTURING METHOD THEREOF

(71) Applicant: SK hynix Inc., Icheon-si Gyeonggi-do (KR)

(72) Inventors: Ki Hong Lee, Suwon-si (KR); Seung Ho Pyi, Seongnam-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/734,140

(22) Filed: Jun. 9, 2015

(65) Prior Publication Data

US 2016/0268263 A1 Sep. 15, 2016

(30) Foreign Application Priority Data

Mar. 11, 2015 (KR) .................. 10-2015-0033817
Apr. 17, 2015 (KR) .................. 10-2015-0054732

(51) Int. Cl.
*H01L 27/115* (2006.01)
*H01L 27/24* (2006.01)

(52) U.S. Cl.
CPC ....... *H01L 27/115* (2013.01); *H01L 27/11504* (2013.01); *H01L 27/11507* (2013.01); *H01L 27/2481* (2013.01)

(58) Field of Classification Search
CPC .......... H01L 27/115; H01L 27/11504; H01L 27/11507; H01L 27/115114; H01L 27/11578; H01L 27/11597; H01L 27/1157; H01L 27/11556; H01L 27/11551; H01L 27/2481; H01L 29/7926
See application file for complete search history.

(56) References Cited

U.S. PATENT DOCUMENTS

| | | | | |
|---|---|---|---|---|
| 9,224,752 B1* | 12/2015 | Lee | ................. | H01L 27/11582 |
| 2012/0032245 A1* | 2/2012 | Hwang | ............. | H01L 27/11551 |
| | | | | 257/314 |
| 2013/0017629 A1* | 1/2013 | Pyo | ........................ | H01L 22/26 |
| | | | | 438/16 |
| 2013/0161710 A1* | 6/2013 | Ji | ....................... | H01L 29/66666 |
| | | | | 257/296 |
| 2013/0161731 A1* | 6/2013 | Bin | ........................ | H01L 29/78 |
| | | | | 257/329 |
| 2013/0320424 A1* | 12/2013 | Lee | ..................... | H01L 27/1158 |
| | | | | 257/314 |
| 2014/0138765 A1* | 5/2014 | Lee | ..................... | H01L 29/7827 |
| | | | | 257/330 |

FOREIGN PATENT DOCUMENTS

| KR | 1020120012728 A | 2/2012 |
|---|---|---|
| KR | 1020120103044 | 9/2012 |
| KR | 1020150063849 A | 6/2015 |
| KR | 1020150067811 A | 6/2015 |
| KR | 1020160020210 A | 2/2016 |

\* cited by examiner

*Primary Examiner* — Galina Yushina
(74) *Attorney, Agent, or Firm* — William Park & Associates LTD.

(57) ABSTRACT

A semiconductor device includes a substrate in which a cell region and contact regions located at both sides of the cell region are defined, a first source layer formed over the substrate, a second source layer formed over the first source layer, a reinforcement pattern formed in the second source layer, a stacked structure including conductive layers and insulating layers alternately stacked over the second source layer and the reinforcement pattern, channel layers passing through the stacked structure and the second source layer and electrically coupled to the second source layer, and an isolation insulating pattern passing through at least one top conductive layer of the conductive layers.

15 Claims, 42 Drawing Sheets

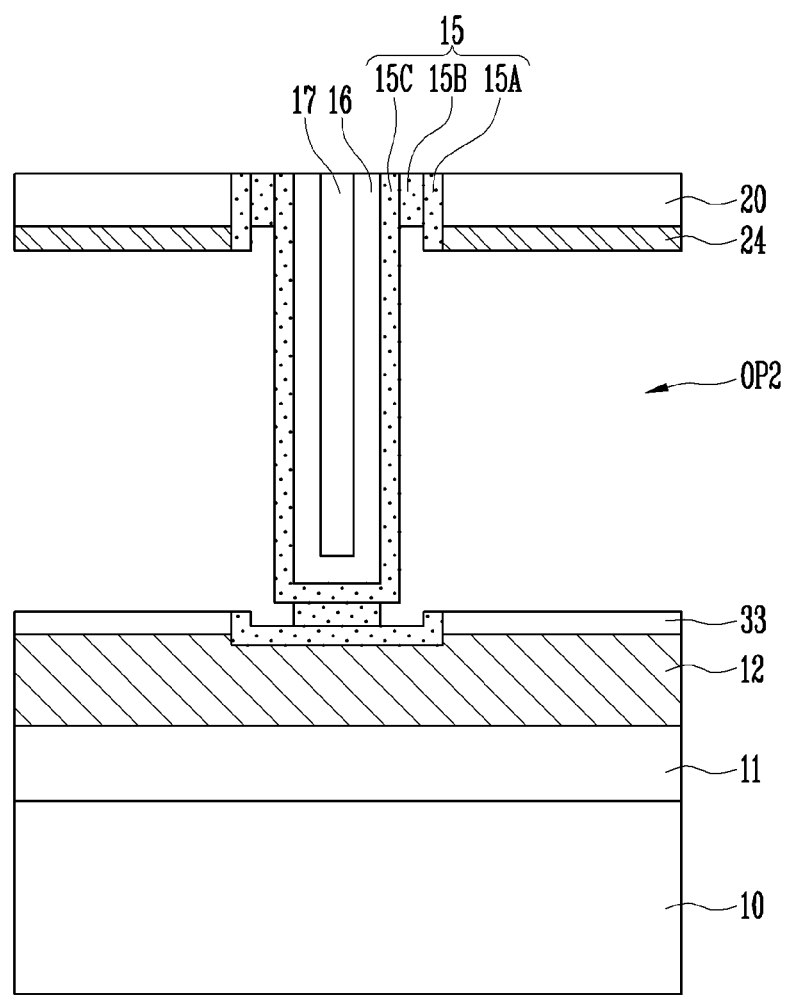

SEMICONDUCTOR DEVICE AND MANUFACTURING METHOD THEREOF

CROSS-REFERENCE TO RELATED APPLICATION

The present application claims priority to Korean patent application number 10-2015-0033817, filed on Mar. 11, 2015 and Korean patent application number 10-2015-0054732, filed on Apr. 17, 2015, the entire disclosures of which are herein incorporated by reference in their entirety.

BACKGROUND

Field of Invention

Various embodiments relate generally to an electronic device and a manufacturing method thereof, and more particularly, to a semiconductor device having a three-dimensional structure and a manufacturing method thereof.

Description of Related Art

Non-volatile memory devices retain stored data in the absence of a power supply. Two-dimensional memory devices having memory cells fabricated in a single layer over a silicon substrate have reached their limits when it comes to increasing their degree of integration. Accordingly, three-dimensional non-volatile memory devices having memory cells stacked in a vertical direction over a silicon substrate have been proposed.

A three-dimensional non-volatile memory device may include a memory string having memory cells stacked on each other. The memory string of the three-dimensional non-volatile memory device may be formed by stacking conductive layers and insulating layers alternately with each other to form a stacked structure, and forming a channel layer passing through the stacked structure.

However, as the height of the stacked structure increases, it may be more difficult to perform an etch process and form a source layer coupled to the memory string. In addition, the memory cells stacked on each other may have non-uniform characteristics due to processing limitations.

SUMMARY

A semiconductor device according to an embodiment may include a substrate in which a cell region and contact regions located at both sides of the cell region are defined. The semiconductor device may also include a first source layer formed over the substrate. The semiconductor device may also include a second source layer formed over the first source layer. The semiconductor device may also include a reinforcement pattern formed in the second source layer. The semiconductor device may also include a stacked structure including conductive layers and insulating layers alternately stacked over the second source layer and the reinforcement pattern. The semiconductor device may also include channel layers passing through the stacked structure and the second source layer and electrically coupled to the second source layer. Further, the semiconductor device may include an isolation insulating pattern passing through at least one top conductive layer of the conductive layers.

In an embodiment, a method of manufacturing a semiconductor device may include forming a first sacrificial layer. The method may also include forming a stacked structure including second sacrificial layers and insulating layers alternately stacked over the first sacrificial layer. The method may also include forming channel layers passing through the stacked structure and the first sacrificial layer and memory layers surrounding the channel layers. The method may also include forming a slit passing through the stacked structure. The method may also include forming a protective layer on an inner wall of the slit. The method may also include forming an opening through which the memory layers are exposed by removing the first sacrificial layer by using the protective layer as an etch barrier. The method may also include removing the memory layers exposed through the opening. Further, the method may include forming a source layer contacting the channel layers in the opening.

In an embodiment, a method of manufacturing a semiconductor device may include forming a sacrificial layer. The method may also include forming a reinforcement pattern in the sacrificial layer. The method may also include forming a stacked structure over the sacrificial layer and the reinforcement pattern. The method may also include forming channel layers passing through the stacked structure and the sacrificial layer. The method may also include forming a slit passing through the stacked structure and exposing the sacrificial layer. The method may also include forming an opening by removing the sacrificial layer through the slit, wherein the opening is supported by the reinforcement pattern. Further, the method may also include forming a source layer and contacting the channel layers in the opening.

BRIEF DESCRIPTION OF THE DRAWINGS

FIGS. 9A to 12A, 9B to 12B, and 13 to 16 are cross-sectional views illustrating a method of manufacturing a semiconductor device according to an embodiment;

FIGS. 17A to 17D are partial enlarged views illustrating a method of manufacturing a semiconductor device according to an embodiment;

DETAILED DESCRIPTION

Figure 1:
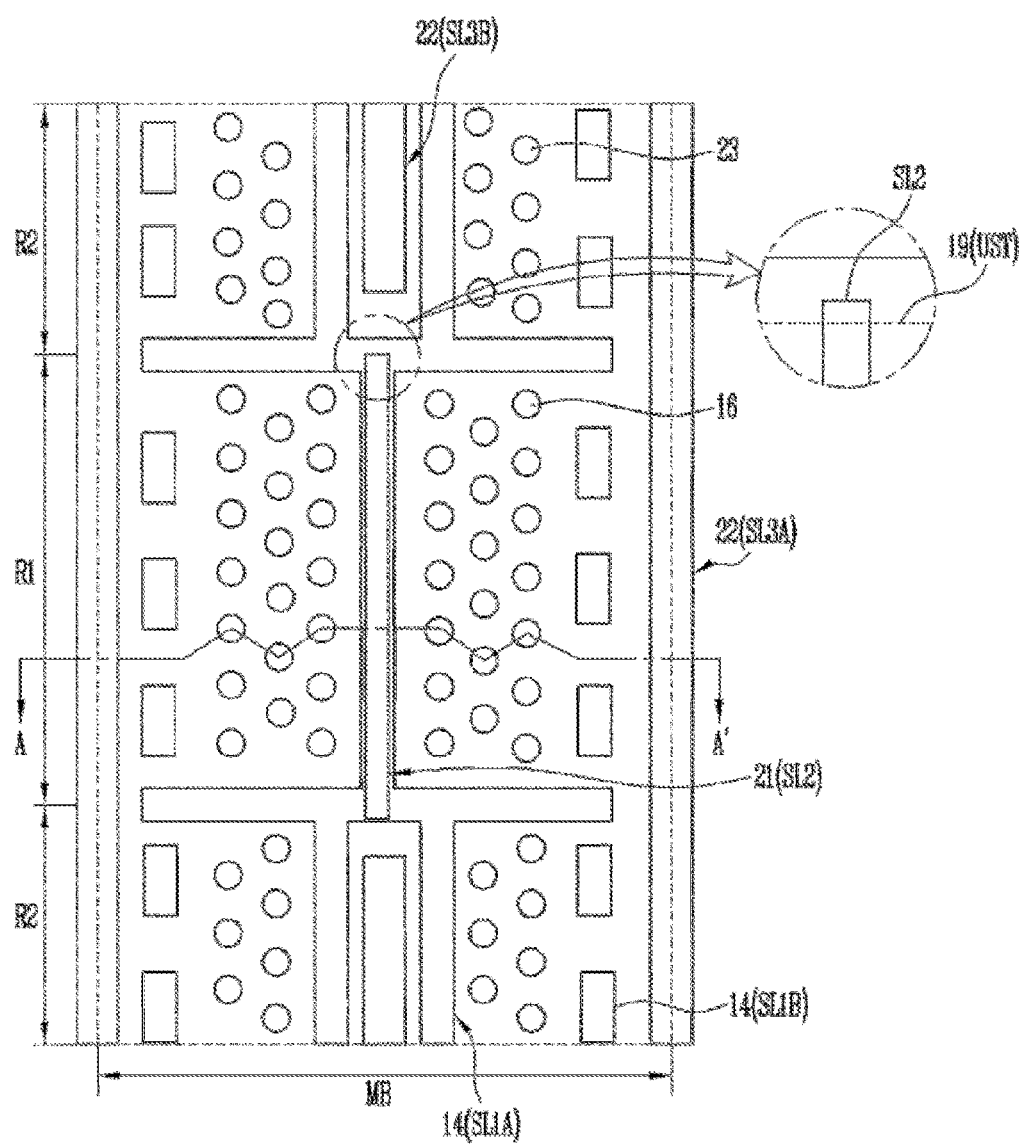
FIG. 1 is a layout view of the structure of a semiconductor device according to an embodiment.

Hereinafter, various embodiments will be described in detail with reference to the accompanying figures. In the figures, thicknesses and lengths of components may be exaggerated for convenience of illustration. In the following description, a detailed explanation of related functions and constitutions may be omitted for simplicity and conciseness. Like reference numerals refer to like elements throughout the specification and figures. Various embodiments are directed to a semiconductor device that is easy to manufacture and has improved characteristics, and a manufacturing method thereof.

Figure 2:
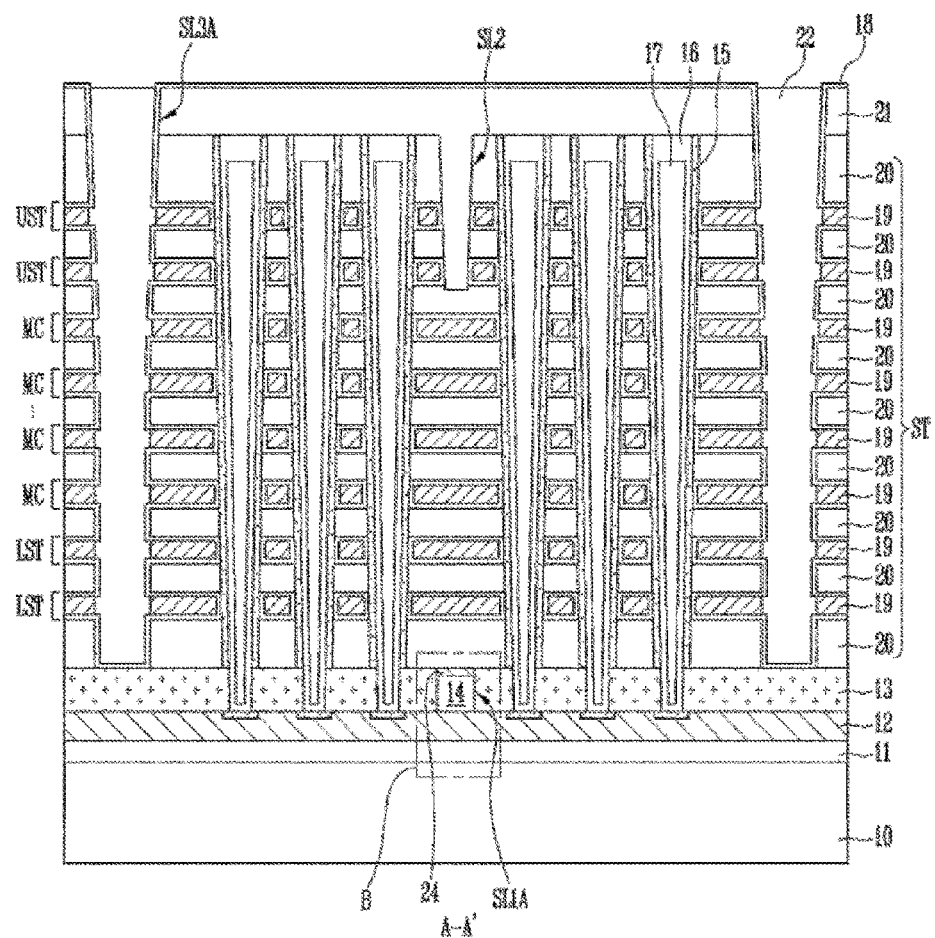
FIG. 2 is a cross-sectional view of the structure of a semiconductor device according to an embodiment.

Referring to FIGS. 1 and 2, a layout view and a cross-sectional view of the structure of a semiconductor device according to an embodiment, respectively are illustrated. FIG. 2 is a cross-sectional view taken along line A-A' of FIG. 1.

In FIGS. 1 and 2, a semiconductor device according to an embodiment may include a substrate 10, a first source layer 12, a second source layer 13, a reinforcement pattern 14, a stacked structure ST, channel layers 16, and an isolation insulating pattern 21.

A cell region R1 and contact regions R2 located at both sides of the cell region R1 may be defined in the substrate 10. Memory strings may be arranged in the cell region R1. Each of the memory strings may include at least one lower selection transistor LST, a plurality of memory cells MC and at least one upper selection transistor UST which are electrically coupled in series. Each of the memory strings may be arranged in a vertical direction to the substrate 10. The memory cells MC may be stacked and separated from each other between at least one lower selection transistor LST and at least one upper selection transistor UST. At least one lower selection transistor LST may be arranged between the memory cells MC and the substrate 10. Gate electrodes (i.e. conductive layers 19) of the memory cells MC may extend to the contact regions R2. In addition, a bias may be applied to each of the gate electrodes stacked on each other in the contact regions R2. The gate electrodes may be stacked in a stepped manner in the contact regions R2 and electrically coupled to contact plugs in the contact region R2.

The first source layer 12 may be located over the substrate 10 and include a conductive material, such as doped polysilicon or metal. For example, the first source layer 12 may be formed by stacking a conductive layer over the substrate 10. In this example, a first insulating layer 11 may be interposed between the substrate 10 and the first source layer 12. In an example, the first source layer 12 may be formed by doping impurities into a surface of the substrate 10 to a predetermined depth. In an example, the first insulating layer 11 may not be formed.

The second source layer 13 may be formed on the first source layer 12 and electrically coupled to the first source layer 12. For example, the second source layer 13 may include a metallic material such as tungsten, or a polysilicon layer.

First slits SL1A and SL1B may penetrate through the second source layer 13. The shape of the second source layer 13 may be defined by the first slits SL1A and SL1B. The first slits SL1A and SL1B may include a type A first slit SL1A and a type B first slit SL1B. The type A first slit SL1A may include first line portions located at the boundaries of the cell region R1 and the contact regions R2, at least one second line portion located in the cell region R1 and connecting the first line portions to each other, and at least one third line portion extending from the first line portions to the contact regions R2. The type B first slit SL1B may be arranged at the boundary between neighboring memory blocks MB in the cell region R1 and the contact regions R2.

Reinforcement patterns 14 may be formed in the first slits SL1A and SL1B. Each of the reinforcement patterns 14 may be an insulating layer which includes an oxide or a nitride. For example, each of the reinforcement patterns 14 may include first line patterns located above the boundaries of the cell region R1 and the contact regions R2. Each of the reinforcement patterns 14 may also include a second line pattern located in the cell region R1, and at least one third line pattern located in the contact region R2. Each of the first line patterns may be formed in each of the first line portions of the type A first slit SL1A. The second line pattern may be formed in the second line portion of the type A first slit SL1A. The third line pattern may be formed in each of the third line portions of the type A first slit SL1A. In addition, the reinforcement pattern 14 may include island patterns located in the cell region R1 or the contact region R2. The island patterns may be located adjacent to the boundary between neighboring memory blocks. Each of the island patterns may be formed in the type B first slit SL1B. However, the shape and position of the reinforcement pattern 14 may vary. In addition, an etch barrier layer 24 may be located on the reinforcement pattern 14. The etch barrier layer 24 may include an oxide or a nitride. The etch barrier layer 24 may have a greater thickness than a data storage layer of each of the first memory layers 15 to be described below. More specifically, the etch barrier layer 24 may be 2.5 times as thick as the storage layer.

The stacked structure ST may be located over the second source layer 13 and the reinforcement patterns 14. The stacked structure ST may include conductive layers 19 and second insulating layers 20 stacked alternately with each other. The conductive layers 19 may be gate electrodes of the upper and lower selection transistors UST and LST and the memory cell MC. The second insulating layers 20 may be formed to insulate the stacked conductive layers 19. For example, the conductive layers 19 may include doped polysilicon, tungsten (W), tungsten nitride (WNx), titanium (Ti), titanium nitride (TiN), tantalum (Ta), tantalum nitride (TaN), or the like. Each of the second insulating layers 20 may include an oxide, a nitride, or the like.

The channel layers 16 may be located in the cell region R1, pass through the stacked structure ST and the second source layer 13, and be electrically coupled to the second source layer 13. The channel layers 16 may partially pass through the second source layer 13. The channel layers 16 may alternatively completely pass through the second source layer 13 to be directly electrically coupled to the first source layer 12. Each of the channel layers 16 may have an open central portion. Further, the open central portion may be filled with a gap-filling insulating layer 17.

Each of the first memory layers 15 may be interposed between each of the channel layers 16 and the conductive layers 19. The first memory layer 15 may surround a sidewall of each of the channel layers 16. The first memory layer 15 may include at least one of a tunnel insulating layer, a data storage layer and a charge blocking layer. The data storage layer may include silicon, nitride, phase-change materials, nanodots, or the like. A second memory layer 18 may be further formed to surround each of the conductive layers 19. The second memory layer 18 may also include at least one of the tunnel insulating layer, the data storage layer and the charge blocking layer. The data storage layer may include silicon, nitride, phase-change materials, nanodots, or the like. The second memory layer 18 in the figures may function as a charge blocking layer and include an oxide.

A second slit SL2 which separates the gate electrode of the upper selection transistor UST may be filled with the isolation insulating pattern 21. For example, the second slit SL2 may pass through at least one conductive layer 19 and be filled with the isolation insulating pattern 21. The isolation insulating pattern 21 may extend from the inside of the second slit SL2 to cover a top surface of the stacked structure ST. For example, the isolation insulating pattern 21 may include an oxide, a nitride, or the like.

The second slit SL2 and the isolation insulating pattern 21 in the second slit SL2 may be located above the reinforcement pattern 14. For example, the isolation insulating pattern 21 in the second slit SL2 may be located above the second line pattern of the reinforcement pattern 14 located in the cell region R1. The isolation insulating pattern 21 may overlap the reinforcement pattern 14. In the layout view of FIG. 1, only the location of the isolation insulating pattern 21 formed in the second slit SL2 is shown. The edge of the second slit SL2 which is adjacent to the contact regions R2 may extend further towards the contact regions R2 than the edge of the conductive layer 19 which forms the gate electrode of the upper selection transistor UST.

The semiconductor device may further include third slits SL3A and SL3B passing through the stacked structure ST and slit insulating layers 22 in the third slits SL3A and SL3B. The third slits SL3A and SL3B may be used as a path for removing sacrificial layers and a path for forming the second source layer 13 during manufacturing processes of the semiconductor device. The third slits SL3A and SL3B may be deep enough to expose the second source layer 13, or deep enough to extend to the first source layer 12. The third slits SL3A and SL3B include a type A third slit SL3A and a type B third slit SL3B. The type A third slit SL3A may be formed at the boundary between neighboring memory blocks MB. The type B third slit SL3B may be arranged in each of the contact regions R2.

In addition, the semiconductor device may further include dummy patterns 23. The dummy patterns 23 may be used as supports when the sacrificial layers are removed to form the conductive layers 19. The dummy patterns 23 may be located in the contact regions R2 or above the reinforcement pattern 14. The dummy patterns 23 may pass through the stacked structure ST and have the same shape as the channel layers 16.

Figure 3:
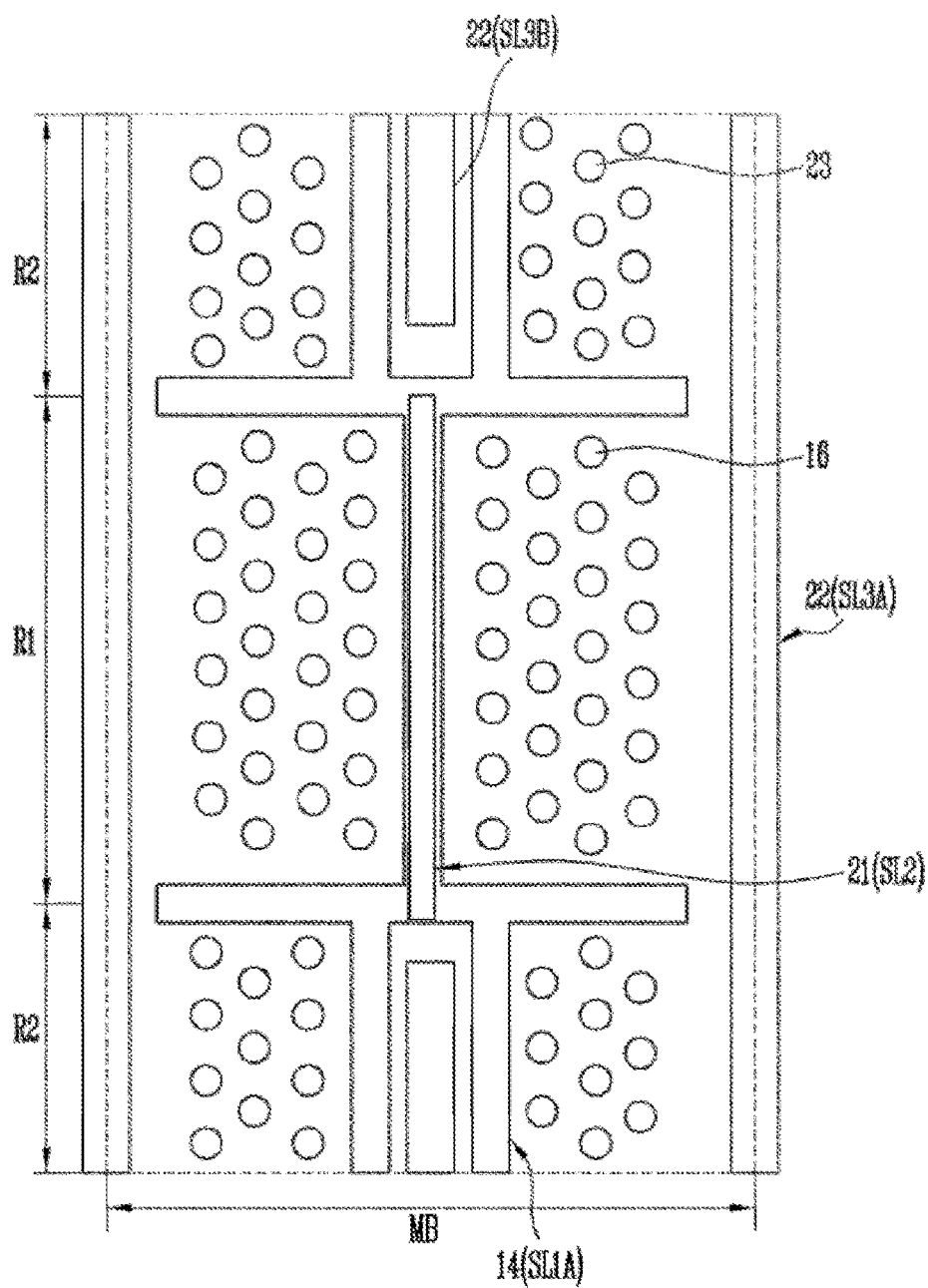
FIG. 3 is a layout view of the structure of a semiconductor device according to an embodiment.

Referring to FIG. 3, a layout view of the structure of a semiconductor device according to an embodiment is illustrated. FIG. 3 is a modified example of FIG. 1. Hereinafter, a description of common contents with earlier described embodiments with reference to FIGS. 1 and 2 is omitted.

In FIG. 3, since the type B first slit SL1B as shown in FIG. 1 may not be formed, a reduction in chip size may be achieved.

Figure 4:
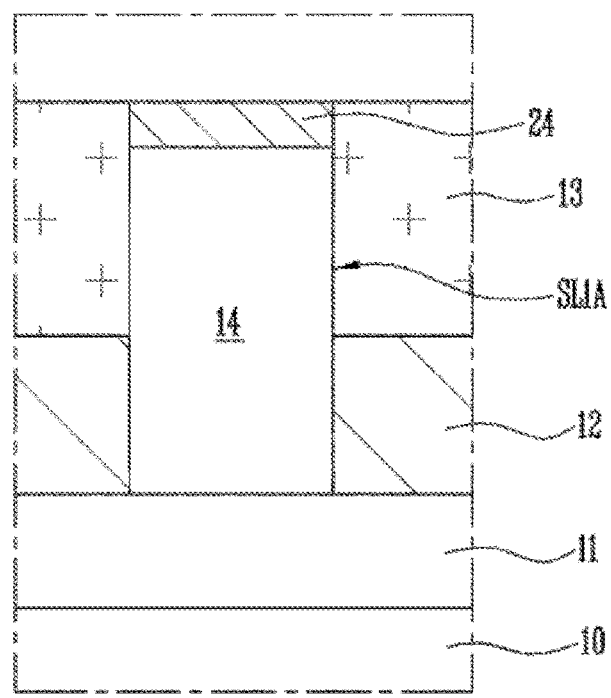
FIG. 4 is a cross-sectional view of the structure of a semiconductor device according to an embodiment.

Referring to FIG. 4, a cross-sectional view of the structure of a semiconductor device according to an embodiment is shown. FIG. 4 is a modified example of FIG. 2 and shows the structure of a modified example corresponding to an area B in FIG. 2. Hereinafter, a description of common contents with earlier described embodiments with reference to FIGS. 1 and 2 is omitted.

In FIG. 4, the reinforcement pattern 14 and the first slit SL1A may pass through the second source layer 13 and the first source layer 12 to extend to a top surface of the first insulating layer 11.

Figure 5:
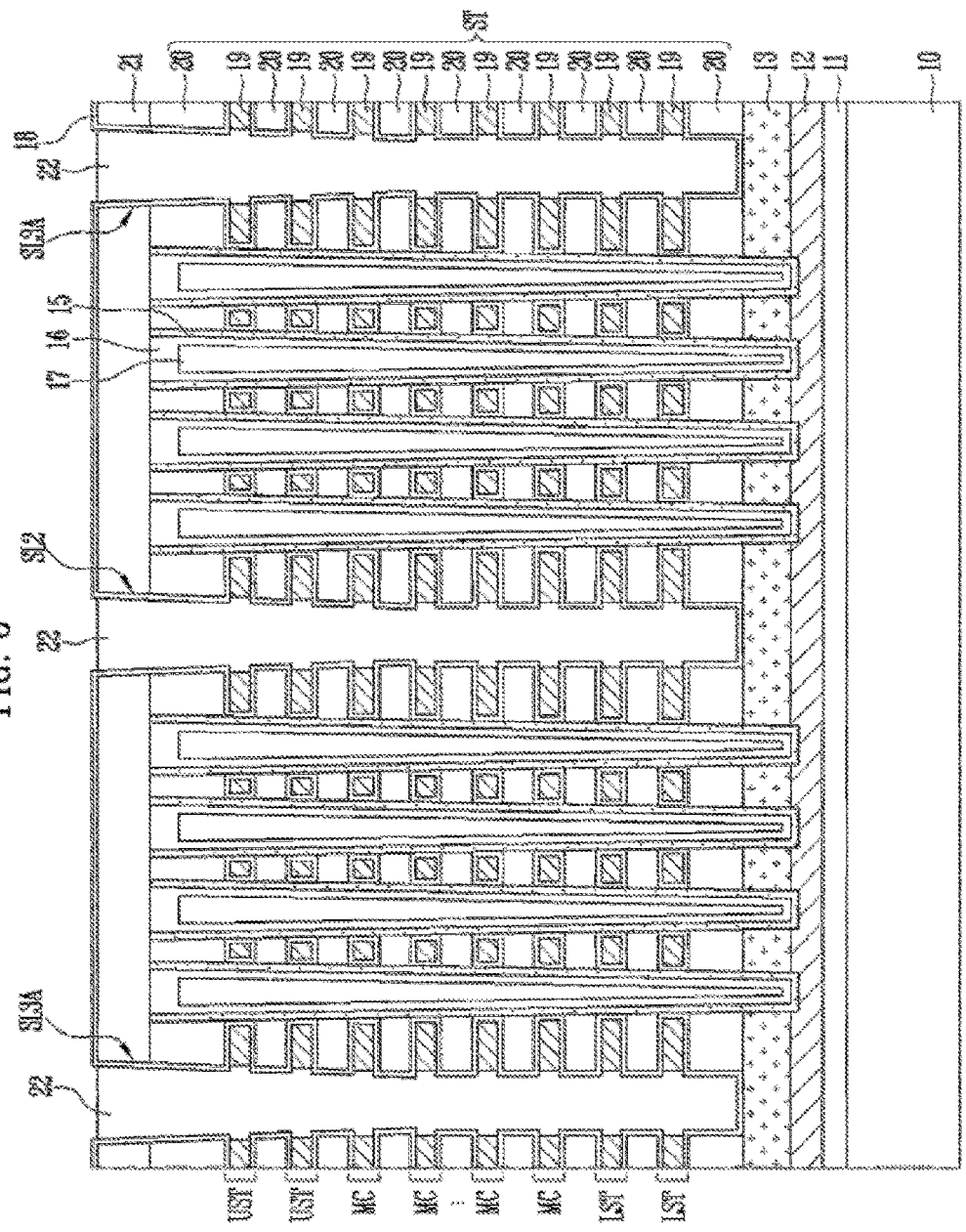
FIG. 5 is a cross-sectional view of the structure of a semiconductor device according to an embodiment.

Referring to FIG. 5, a cross-sectional view of the structure of a semiconductor device according to an embodiment that shows a modified example of FIG. 2 is illustrated. Hereinafter, a description of common contents with earlier described embodiments with reference to FIGS. 1 and 2 is omitted.

In FIG. 5, the second slit SL2 may be deep enough to completely pass through the stacked structure ST. The second slit SL2 and the third slit SL3A may be formed at the same time and have substantially the same depth. The slit insulating layers 22 may be formed in the second slit SL2 and the third slit SL3A. In addition, a reinforcement pattern may be located at a position where the reinforcement pattern may not overlap the second slit SL2 and the third slit SL3A.

The number of channel layers 16 arranged between the second slit SL2 and the third slit SL3A may vary. In addition, the channel layers 16 may be arranged into various configurations, such as a matrix or a staggered structure.

Figure 6:
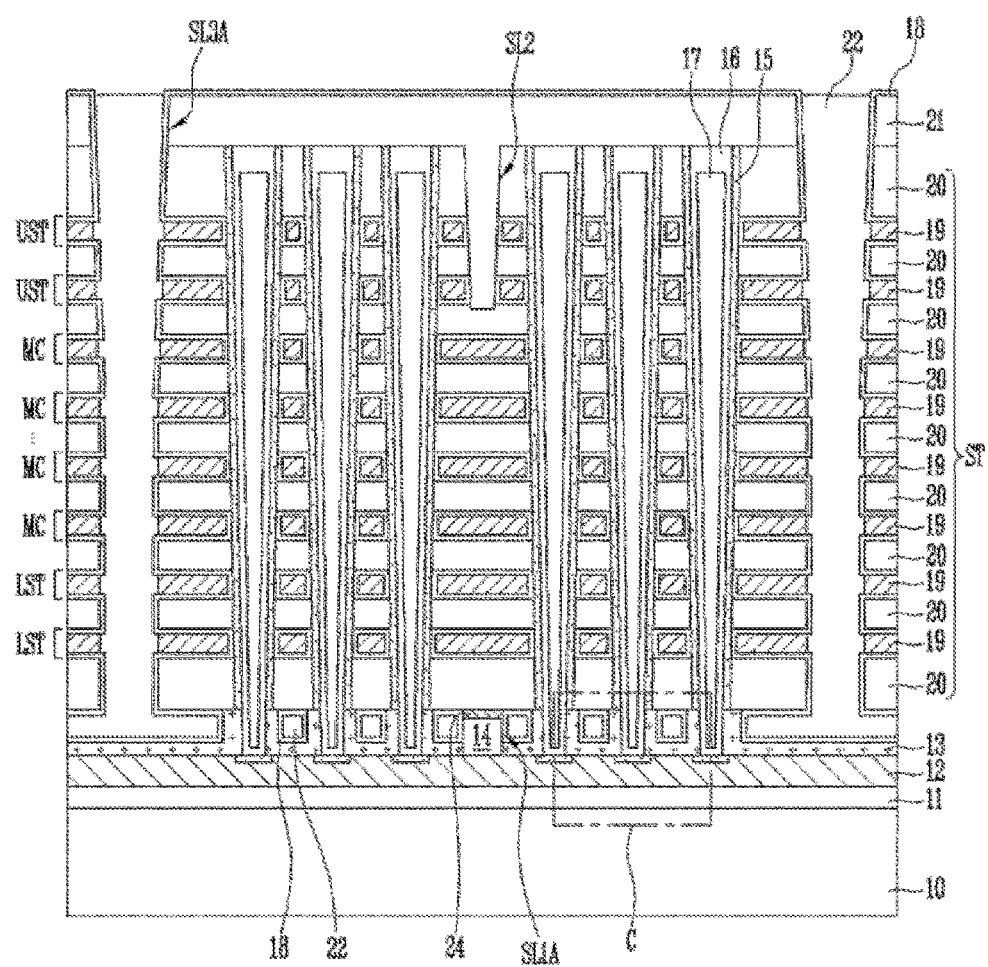
FIG. 6 is a cross-sectional view of the structure of a semiconductor device according to an embodiment.

Referring to FIG. 6, a cross-sectional view of the structure of a semiconductor device according to an embodiment is illustrated. FIG. 6 shows a modified example of FIG. 2. Hereinafter, a description of common contents with earlier described embodiments with reference to FIGS. 1 and 2 is omitted.

In FIG. 6, the second source layer 13 may be formed on portions of a top surface of the first source layer 12 arranged between the channel layers 16 and surfaces of bottom portions of the channel layers 16 adjacent to the first source layer 12. A concave portion may be formed in the surface of the second source layer 13. The concave portion in the second source layer 13 may be formed under the third slit SL3A and have a greater width than the third slit SL3A. The concave portion in the second source layer 13 may be electrically coupled to the first slit SL1A. The second memory layer 18 may extend over the surface of the concave portion in the second source layer 13. The slit insulating layer 22 which fills the third slit SL3A may extend into the concave portion in the second source layer 13 to completely fill the concave portion in the second source layer 13.

Figure 7:
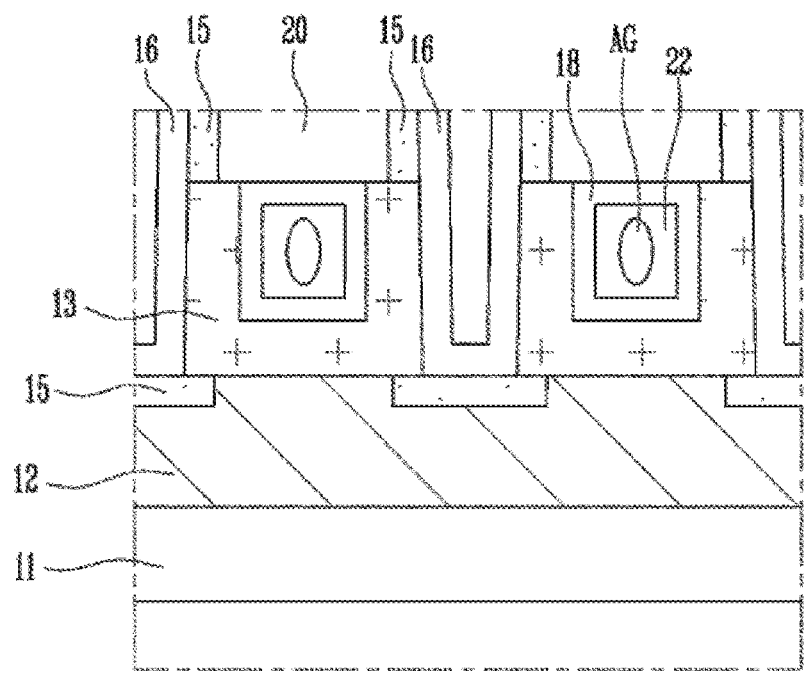
FIG. 7 is a cross-sectional view of the structure of a semiconductor device according to an embodiment.

Referring to FIG. 7, a cross-sectional view of the structure of a semiconductor device according to an embodiment is illustrated. FIG. 7 is a modified example of FIG. 6 and shows the structure of a modified example corresponding to an area C of FIG. 6. Hereinafter, a description of common contents with earlier described embodiments with reference to FIGS. 1 and 2 is omitted.

In FIG. 7, the slit insulating layer 22 which fills the third slit SL3A may extend into the concave portion in the second source layer 13 and include a gap AG. The gap AG may be an air gap. The gap AG may be disposed in a narrow space between neighboring channel layers 16. The gap AG may be disposed in a narrow space between the reinforcement pattern 14 and the channel layer 16. The gap AG may extend in a direction in which the third slit SL3A extends in a horizontal direction. The direction in which the third slit SL3A extends in the horizontal direction may be defined as a direction parallel to the surface of the substrate 10.

Figure 8:
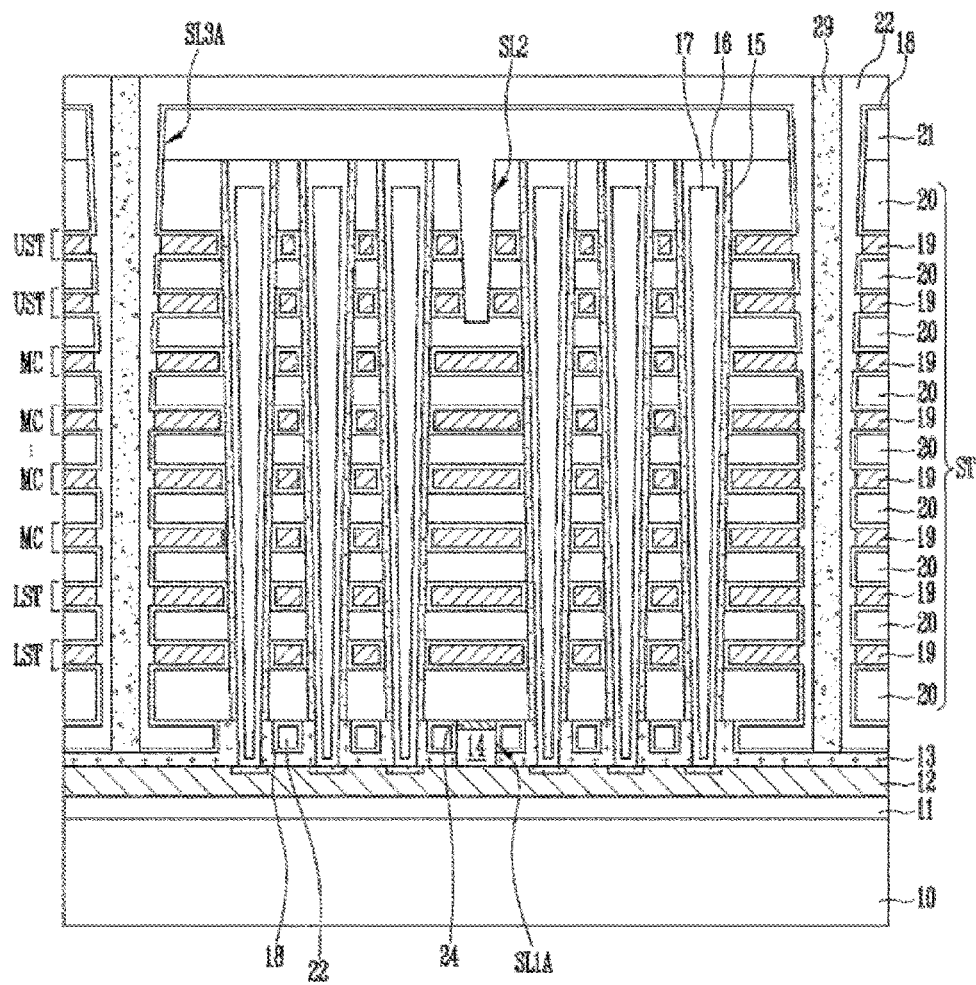
FIG. 8 is a cross-sectional view of the structure of a semiconductor device according to an embodiment.

Referring to FIG. 8, a cross-sectional view of the structure of a semiconductor device according to an embodiment is illustrated. FIG. 8 is a modified example of FIG. 6. Hereinafter, a description of common contents with earlier described embodiments with reference to FIGS. 1 and 2 is omitted.

In FIG. 8, the slit insulating layer 22 may be formed on a sidewall of the third slit SL3A to open a central portion of the third slit SL3A passing through the stacked structure ST. The slit insulating layer 22 may extend over the surface of the concave portion in the second source layer 13. The slit insulating layer 22 which is located outside of the third slit SL3A may extend substantially parallel to the top surface of the stacked structure ST. The central portion of the third slit SL3A which is opened by the slit insulating layer 22 may be filled with a common source line 29. The common source line 29 may extend to contact the second source layer 13. The common source line 29 may extend in the direction in which the third slit SL3A extends in the horizontal direction. The common source line 29 may transfer an externally applied source voltage to the second source layer 13. The common source line 29 may include polysilicon, or a metallic material having a lower resistance than polysilicon.

In the above-described embodiments with reference to FIGS. 1 to 8, no layers, including the etch barrier layer 24, may be formed between the reinforcement pattern 14 and the stacked structure ST. Instead, the reinforcement pattern 14 may directly contact a bottom layer of the second insulating layers 20 of the stacked structure ST.

Referring FIGS. 9A to 12A, 9B to 12B, and 13 to 16, cross-sectional views illustrating a method of manufacturing a semiconductor device according to an embodiment are described. FIGS. 9A, 10A, 11A and 12A are layout views, and FIGS. 9B, 10B, 11B and 12B are cross-sectional views taken along line A-A' of FIGS. 9A, 10A, 11A and 12A, respectively.

Figure 9A:
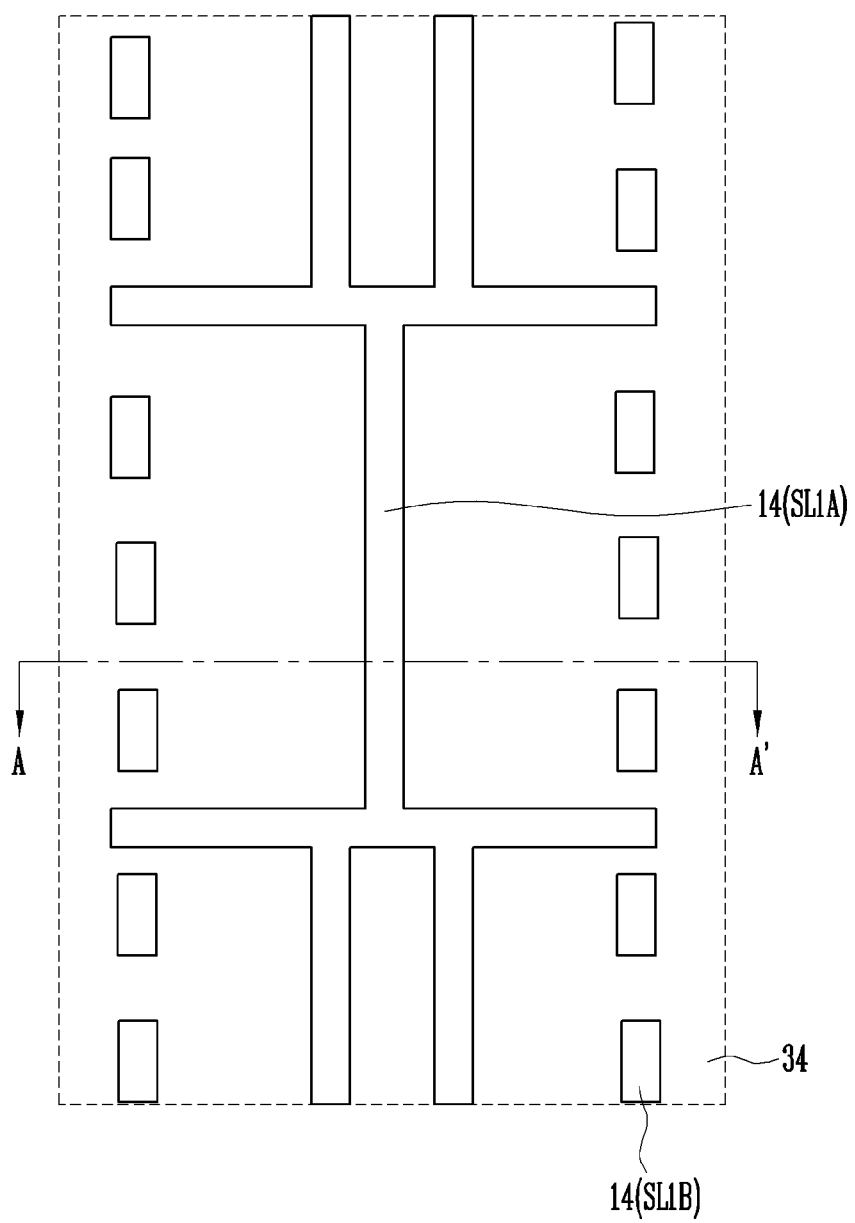
Figure 9B:
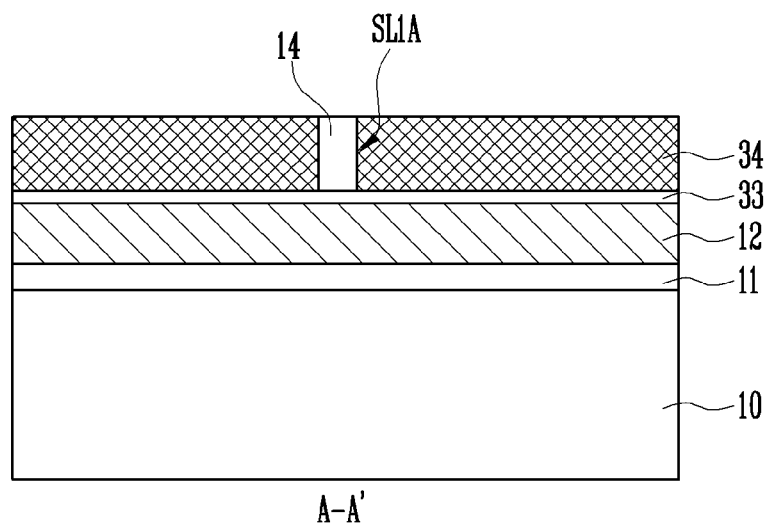

In FIGS. 9A and 9B, a first insulating layer 11 may be formed on a substrate 10. Further, a first source layer 12 may be formed on the first insulating layer 11. The first source layer 12 may be a conductive layer including a doped polysilicon layer, a metal layer, or the like.

Subsequently, a first sacrificial layer 34 may be formed over the first source layer 12. A second sacrificial layer 33 may be formed on the first source layer 12 before the first sacrificial layer 34 is formed. The first sacrificial layer 34 may include a material having a high etch selectivity with respect to the second sacrificial layer 33. For example, the first sacrificial layer 34 may include an undoped polysilicon layer or a doped polysilicon layer. Further, the second sacrificial layer 33 may include an oxide or a nitride.

Subsequently, the first slits SL1A and SL1B may be formed through the first sacrificial layer 34. In addition, a reinforcement pattern 14 may be formed in each of the first slits SL1A and SL1B. The first slits SL1A and SL1B may be deep enough to pass through the first sacrificial layer 34 to expose the second sacrificial layer 33, the first source layer 12, or the first insulating layer 11. After the first slits SL1A and SL1B are formed, a reinforcement layer may be formed on the first source layer 12 to fill the first slits SL1A and SL1B. Subsequently, the reinforcement layer may be planarized until the surface of the first sacrificial layer 34 is exposed, so that the reinforcement pattern 14 may be formed. As described above with reference to FIGS. 1 and 2, the first slits SL1A and SL1B may include the type A first slit SL1A and the type B first slit SL1B. As described above with reference to FIG. 3, the type B first slit SL1B may not be formed. The reinforcement pattern 14 may be an insulating layer including an oxide, a nitride, or the like. As shown in FIGS. 9A and 9B, the reinforcement pattern 14 may include a line pattern and an island pattern. However, the position and shape of the reinforcement pattern 14 may vary.

Figure 10A:
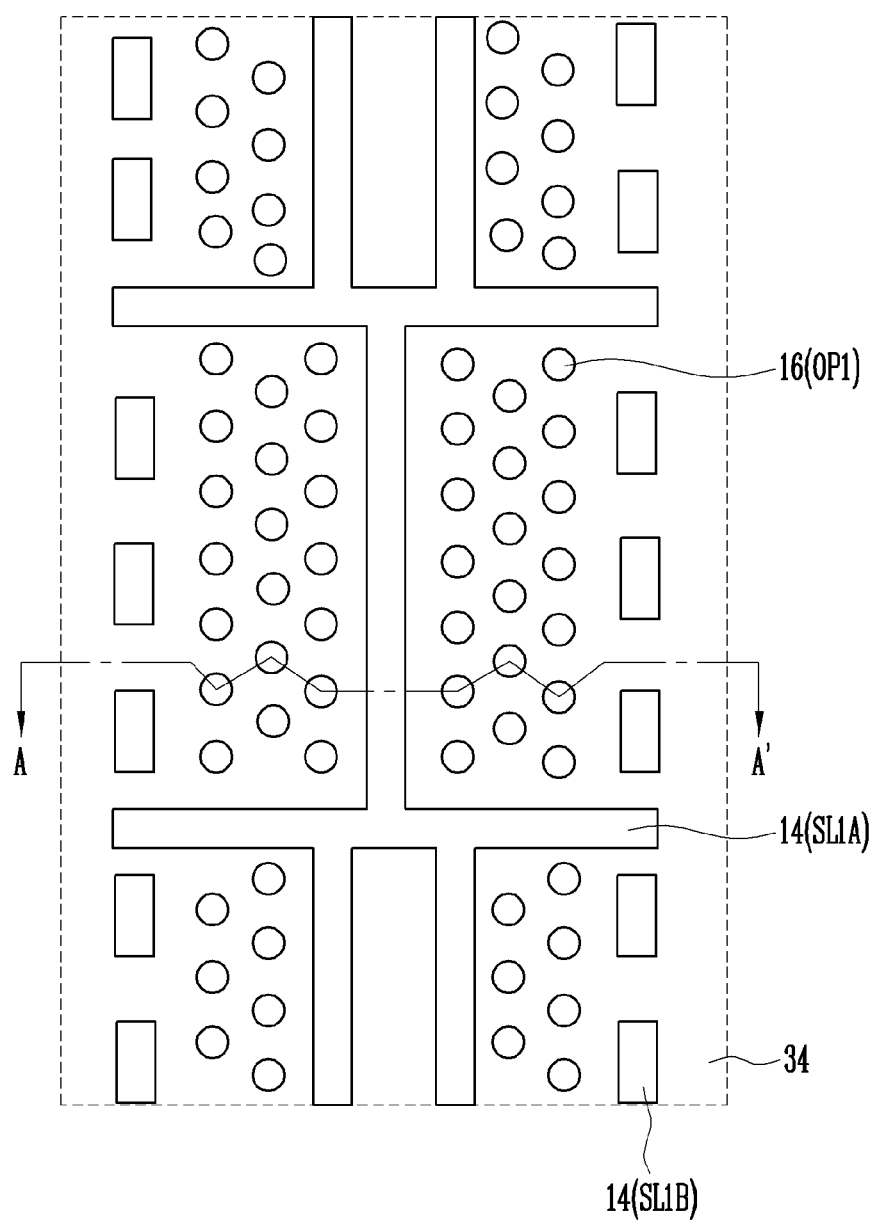
Figure 10B:
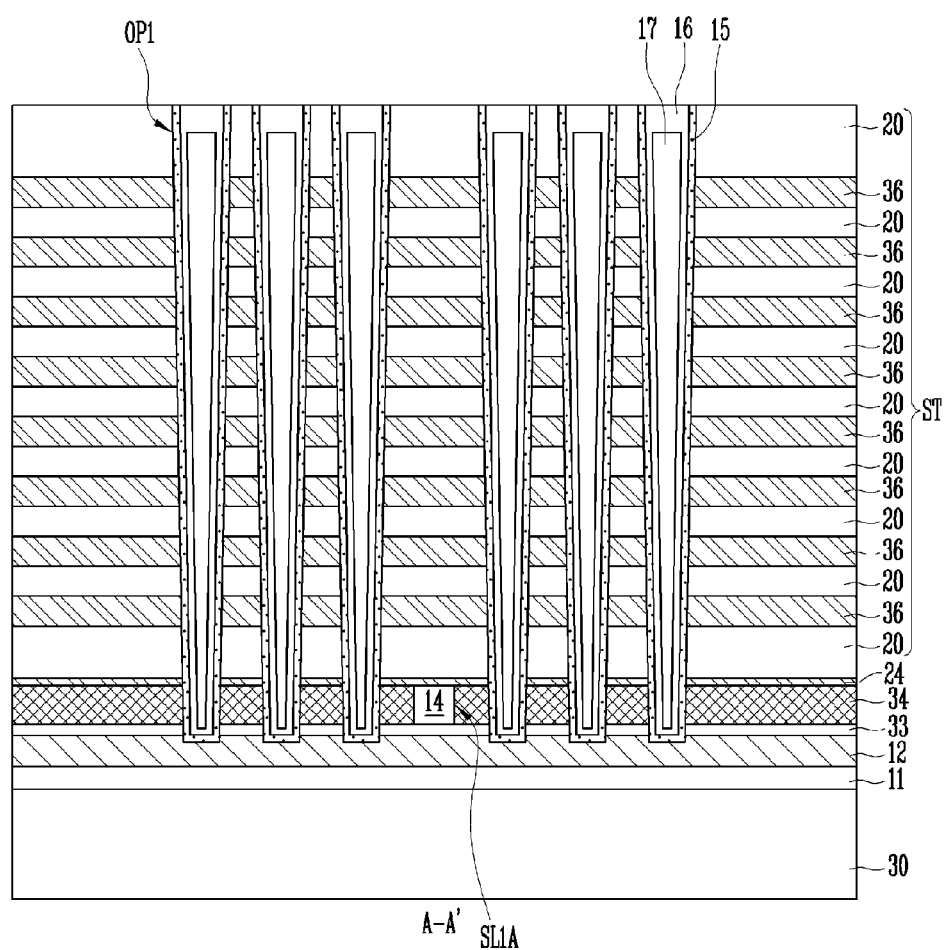

In FIGS. 10A and 10B, the stacked structure ST may be formed over the first sacrificial layer 34 through which the reinforcement pattern 14 passes. The stacked structure ST may include third sacrificial layers 36 and second insulating layers 20 stacked alternately with each other. The third sacrificial layers 36 may have a high etch selectivity with respect to the second insulating layers 20. For example, the third sacrificial layers 36 may include a nitride. Further, the second insulating layers 20 may include an oxide.

The third sacrificial layers 36 and the second insulating layers 20 may have the same or different thicknesses. In addition, a top layer which is the most distant from the substrate 10, among the second insulating layers 20, and a bottom layer of the second insulating layers 20 which is the closest to the substrate 10 may have a greater thickness than the other insulating layers interposed therebetween. The bottom layer of the second insulating layers 20 may be arranged closer to the substrate 10 than a bottom layer of the third sacrificial layers 36. In other words, the bottom layer of the second insulating layers 20 may define a bottom layer of the stacked structure ST.

Before the stacked structure ST is formed, an etch barrier layer 24 may be formed. The etch barrier layer 24 may be formed to prevent the bottom layer of the stacked structure ST, which is the bottom layer of the second insulating layers 20, from being etched and thinned during a subsequent etch process. The etch barrier layer 24 may include a material having a high etch selectivity with respect to the second insulating layers 20. For example, the etch barrier layer 24 may include the same material as the third sacrificial layers 36.

Subsequently, first openings OP1 may be formed through the stacked structure ST, the etch barrier layer 24 and the first sacrificial layer 34. The first openings OP1 may completely pass through the first sacrificial layer 34 to extend to the second sacrificial layer 33 or the first source layer 12. In addition, the first openings OP1 may be located in a cell region or a contact region. The first openings OP1 located in the cell region may be channel holes. In addition, the first openings OP1 located in the contact region may be dummy holes. The channel holes may not overlap the reinforcement pattern 14, whereas the dummy holes may not overlap the reinforcement pattern 14, or may overlap the reinforcement pattern 14.

After first memory layers 15 may be formed in the first openings OP1, channel layers 16 may be formed therein. When the channel layers 16 have central open portions, gap-filling insulating layers 17 may be formed in the channel layers 16.

Figure 11A:
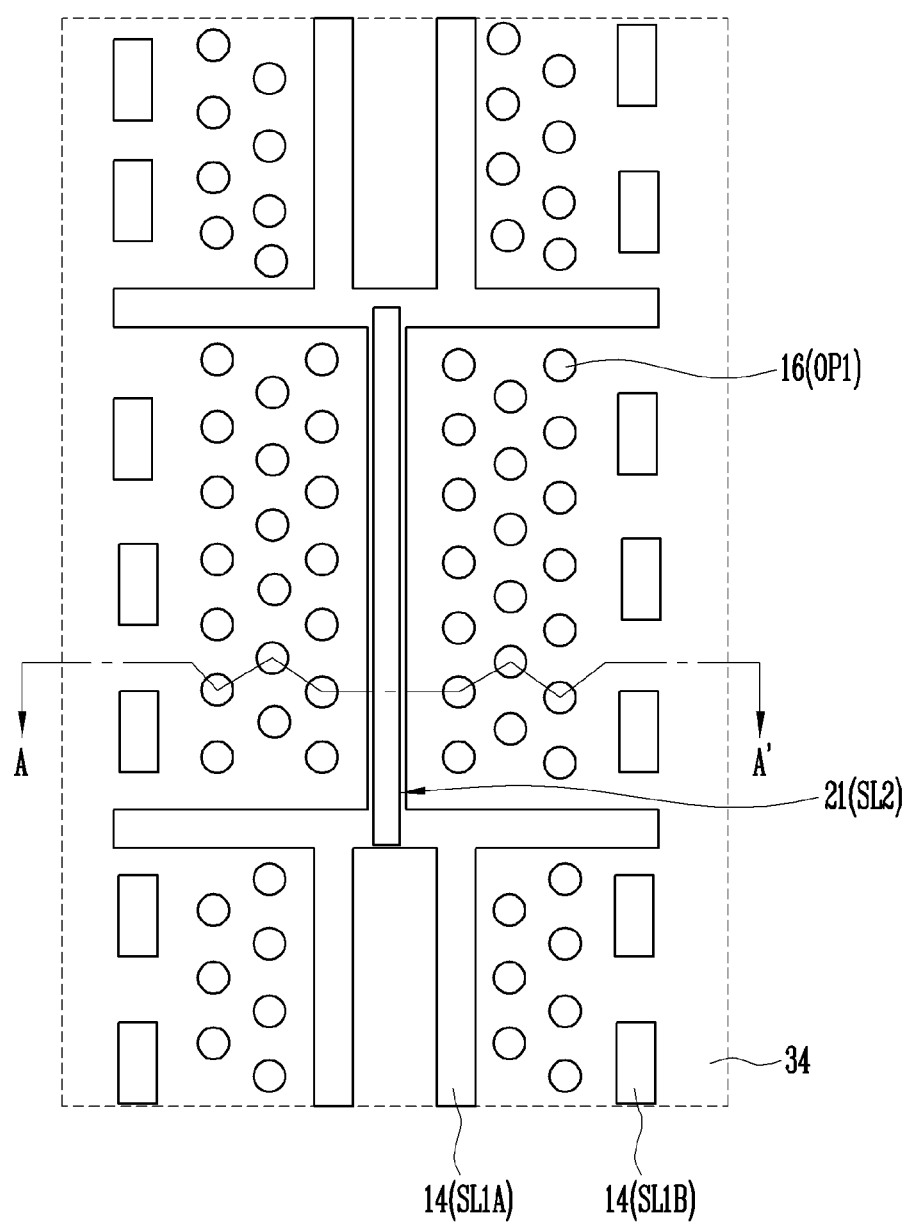
Figure 11B:
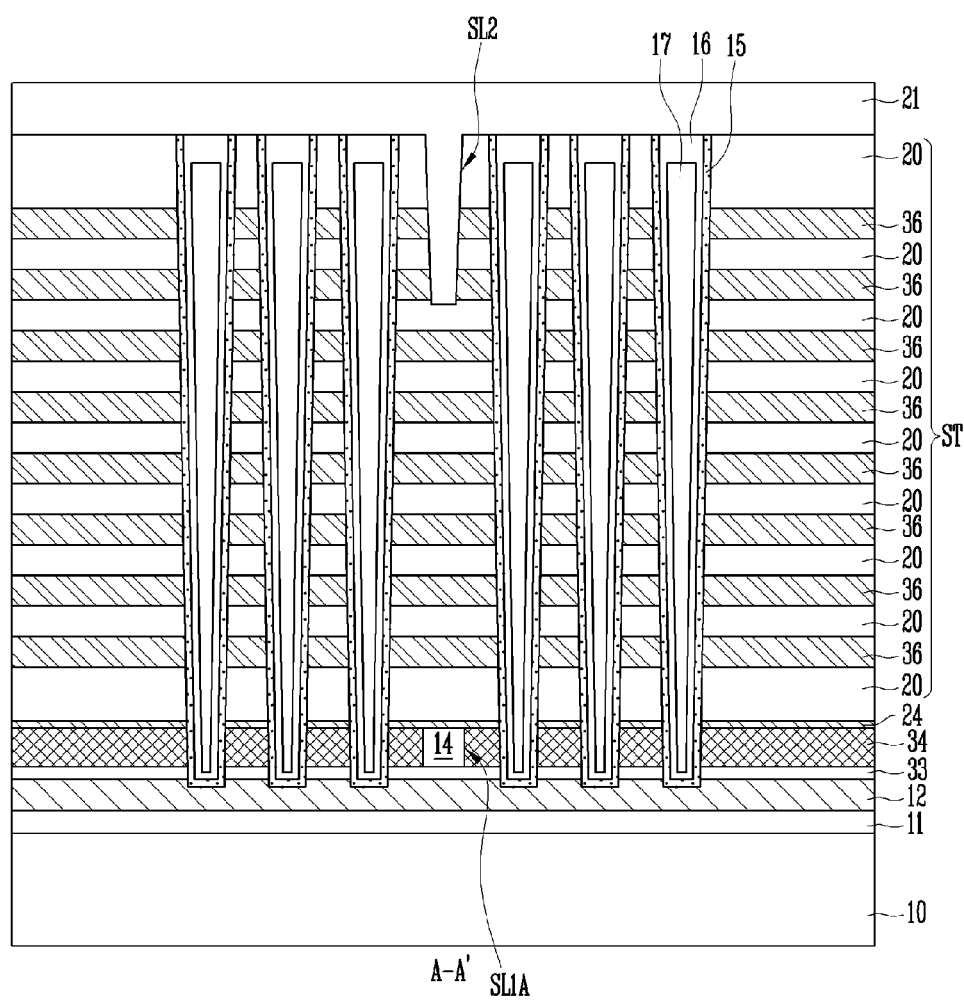

In FIGS. 11A and 11B, the second slit SL2 may be formed through the stacked structure ST from the top layer which is the most distant from the substrate 10, among the third sacrificial layers 36, to at least one of the remaining third sacrificial layers 36. The second slit SL2 may be formed above the reinforcement pattern 14 located in the cell region. The second slit SL2 may overlap the reinforcement pattern 14.

Subsequently, an isolation insulating pattern 21 may be formed in the second slit SL2. The isolation insulating pattern 21 formed in the second slit SL2 may pass through an upper part of the stacked structure ST and overlap the reinforcement pattern 14 located in the cell region. After the second slit SL2 is formed, an insulating layer may be formed to fill the second slit SL2. Subsequently, the insulating layer may be planarized to form the isolation insulating pattern 21. The isolation insulating pattern 21 may be formed over the stacked structure ST as well as in the second slit SL2.

Figure 12A:
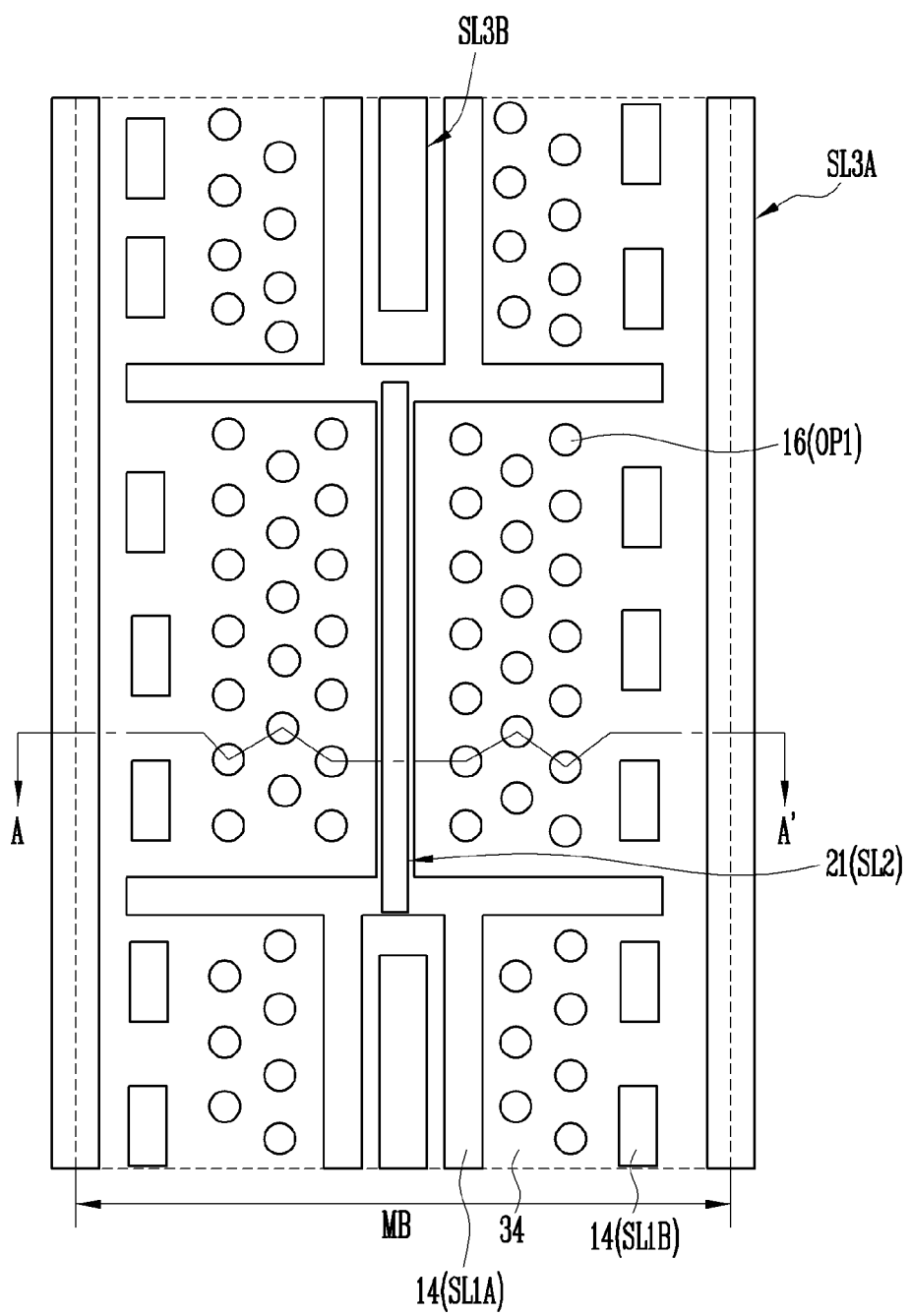
Figure 12B:
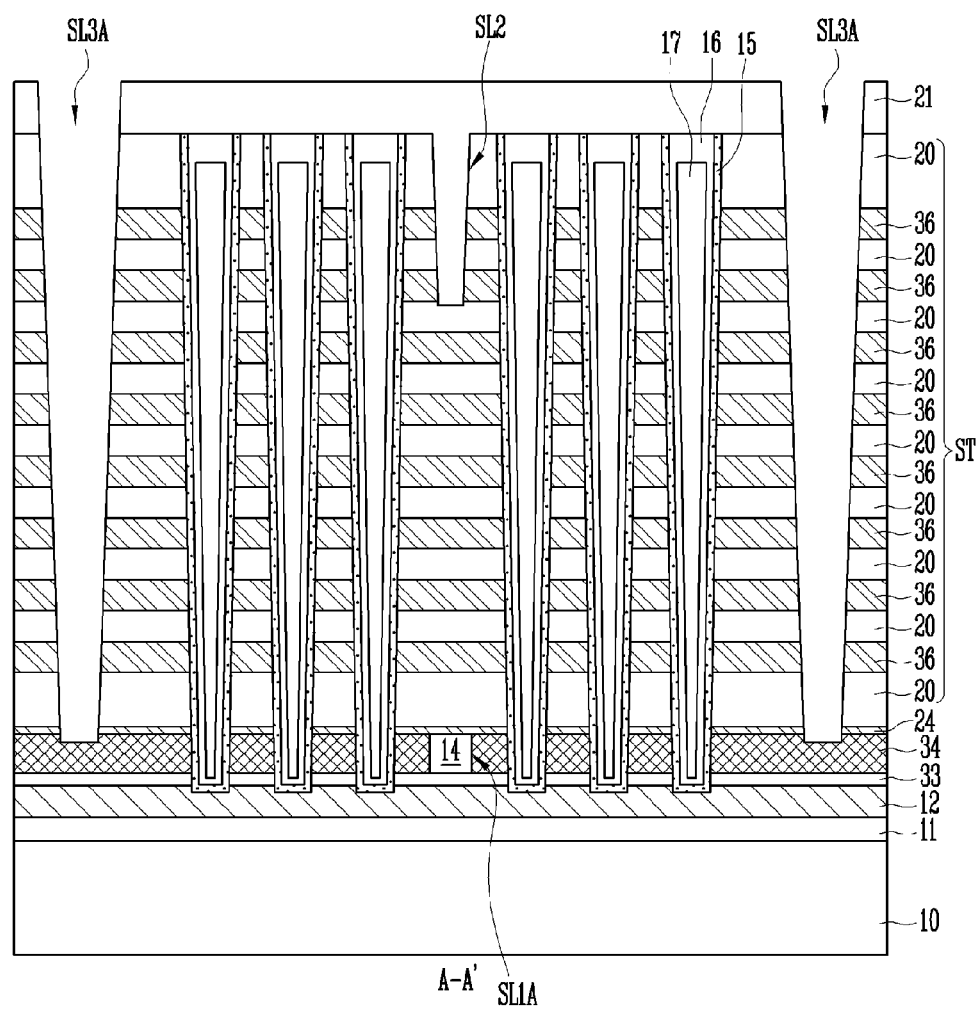

In FIGS. 12A and 12B, the third slits SL3A and SL3B may be formed through the stacked structure ST and the etch barrier layer 24. Upper and lower parts of each of the third slits SL3A and SL3B may have equal widths. In the alternative, the upper part thereof may be wider than the lower part thereof. As described above with reference to FIGS. 1 and 2, the third slits SL3A and SL3B may include the type A third slit SL3A and the type B third slit SL3B. The third slits SL3A and SL3B may be used as a path for removing the first sacrificial layer 34 and a path for forming a second source layer. The third slits SL3A and SL3B may be deep enough to completely pass through the stacked structure ST and the etch barrier layer 24 to expose the first sacrificial layer 34. In addition, the third slits SL3A and SL3B may be located at the boundary between neighboring memory blocks MB or in the contact region.

Figure 13:
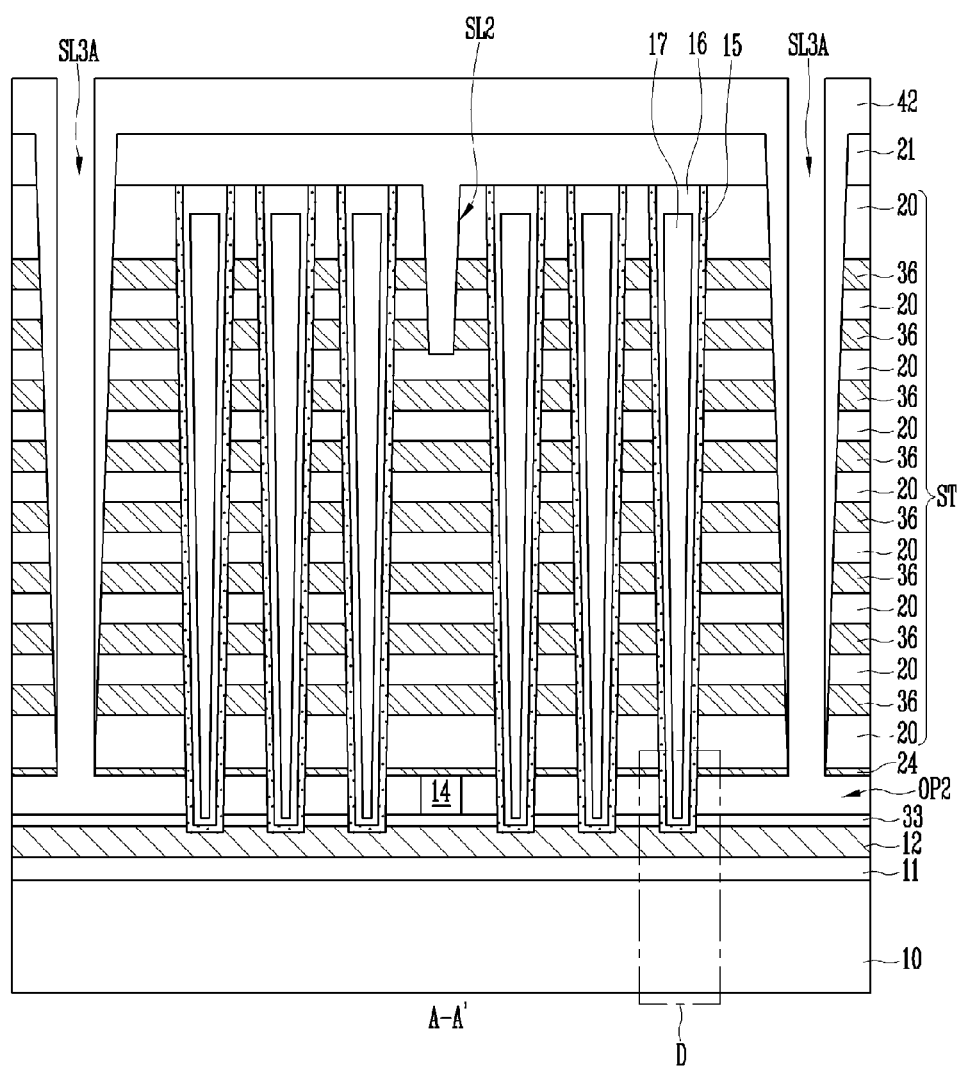

In FIG. 13, the first sacrificial layer 34 may be selectively removed through the third slits SL3A (SL3B in FIG. 12A) to form a second opening OP2, so that a portion of a first memory layer 15 surrounding the channel layer 16 may be exposed through the second opening OP2. The reinforcement pattern 14 formed in the first sacrificial layer 34 may not be removed but remain, and support the stacked structure ST to maintain the second opening OP2. In other words, the second opening OP2 may be stably maintained by the reinforcement pattern 14. Further, the reinforcement pattern 14 may prevent leaning or collapse of the stacked structure ST formed over the second opening OP2. FIG. 13 also illustrates an area D. The process performed on the area D will be described in detail with reference to FIGS. 17A to 17D in connection with the area D.

Subsequently, a protective layer 42 may be formed in the third slit SL3A (SL3B in FIG. 12A). The protective layer 42 may be formed on a sidewall of the third slit SL3A (SL3B in FIG. 12A) to maintain the connection between the second opening OP2 and the third slit SL3A (SL3B in FIG. 12A). However, a bottom surfaces of the third slit SL3A (SL3B in FIG. 12A) may not be completely blocked by the protective layer 42. The protective layer 42 may be tapered so that the thickness thereof may gradually decrease from the upper portion of the third slit SL3A (SL3B in FIG. 12A) to the lower portion thereof adjacent to the substrate 10. In addition, the protective layer 42 may be formed over the stacked structure ST as well as in the third slits SL3A (SL3B in FIG. 12A). For example, the protective layer 42 may be formed by using a deposition method having poor step coverage, such as Plasma Enhanced Chemical Vapor Deposition (PE-CVD). As described above, by forming the tapered protective layer 42 on the sidewall of the third slit SL3A (SL3B in FIG. 12A), a width difference between the upper and lower portions of each of the third slits SL3A (SL3B in FIG. 12A) may be reduced. The protective layer 42 may include a material having a high etch selectivity with respect to the first sacrificial layer 34, and include a nitride. After the protective layer 42 is formed in the third slits SL3A (SL3B in FIG. 12A), the first sacrificial layer 34 may be removed.

Figure 14:
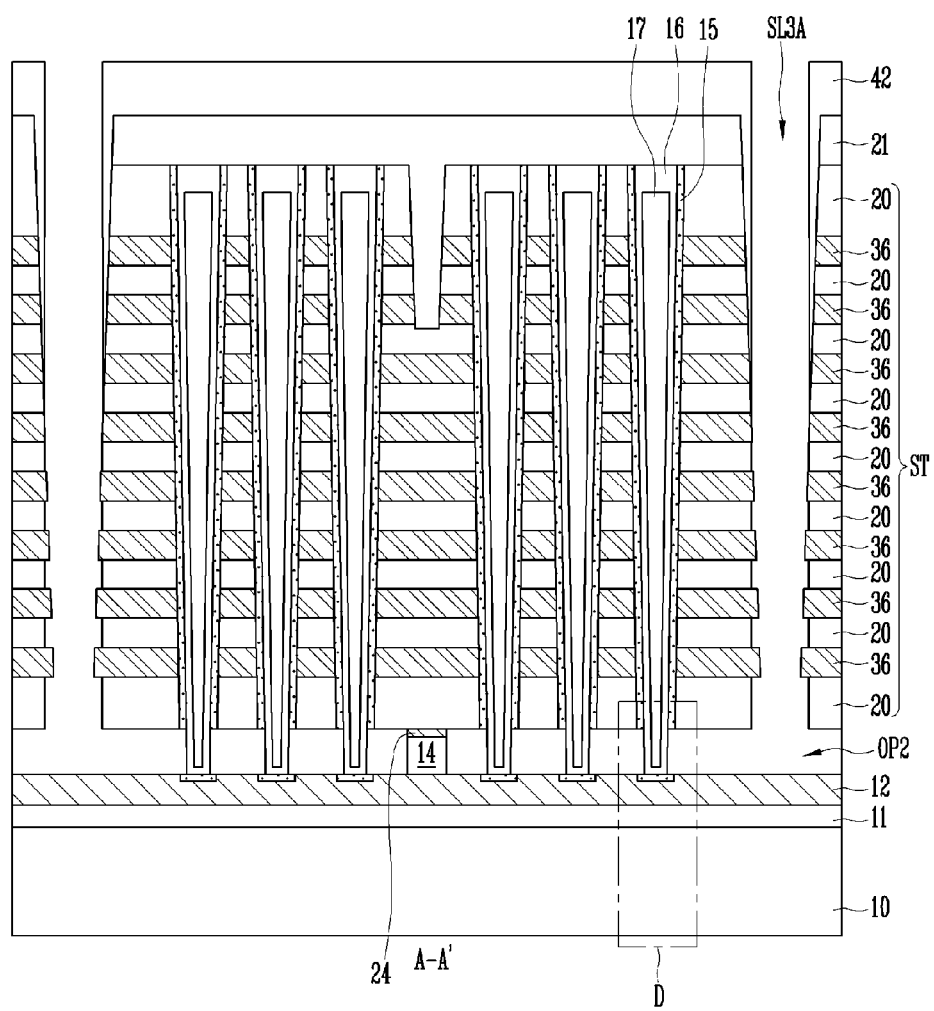

In FIG. 14, the first memory layers 15 exposed through the second opening OP2 may be removed, so that the channel layers 16 may be partially exposed through the second opening OP2. When the first memory layers 15 extend into the first source layer 12, a portion of the first memory layers 15 may remain in the first source layer 12.

When the first memory layers 15 are removed, the second sacrificial layer 33 and the etch barrier layer 24 exposed through the second opening OP2 may also be removed. In addition, the third sacrificial layers 36 and the second insulating layers 20 not covered by the protective layer 42 and are exposed through the lower portions of the third slits SL3A (SL3B in FIG. 12A) may be etched. The third sacrificial layers 36 or the second insulating layers 20 may be selectively etched when a plurality of layers included in the first memory layer 15 are etched. Therefore, unevenness may be formed on the lower portion of each of the third slits SL3A (SL3B in FIG. 12A). For example, the second insulating layers 20 not blocked by the protective layer 42 may be etched deeper than the third sacrificial layers 36. In an example, the etched third sacrificial layers 36 may remain so that the etched third sacrificial layers 36 may protrude further toward the inside of the third slits SL3A (SL3B in FIG. 12A) than the second insulating layers 20. The process of removing the first memory layers 15 will be described in detail with reference to FIGS. 17A to 17D.

Figure 15:
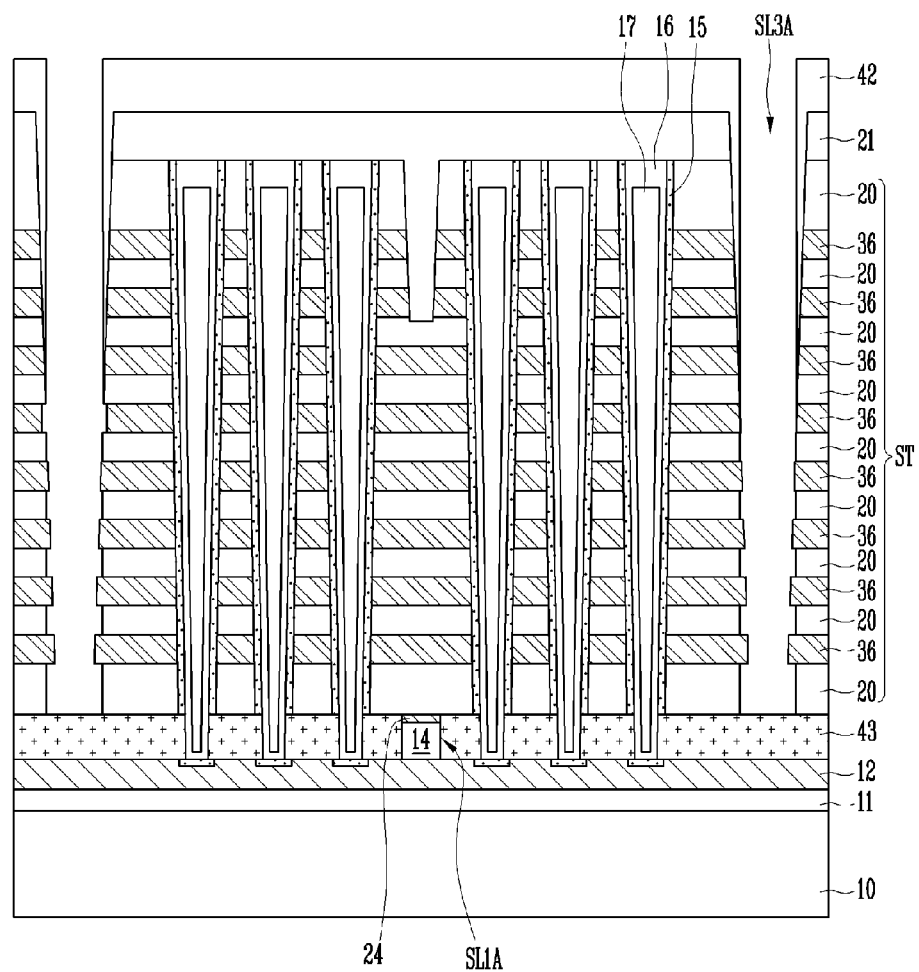

In FIG. 15, a second source layer 13 which is electrically coupled to the channel layers 16 may be formed in the second opening OP2. For example, by using the channel layers 16 which are exposed through the second opening OP2 as a seed, the second source layer 13 may be selectively grown from the channel layers 16. The second source layer 13 may include a polysilicon layer.

Figure 16:
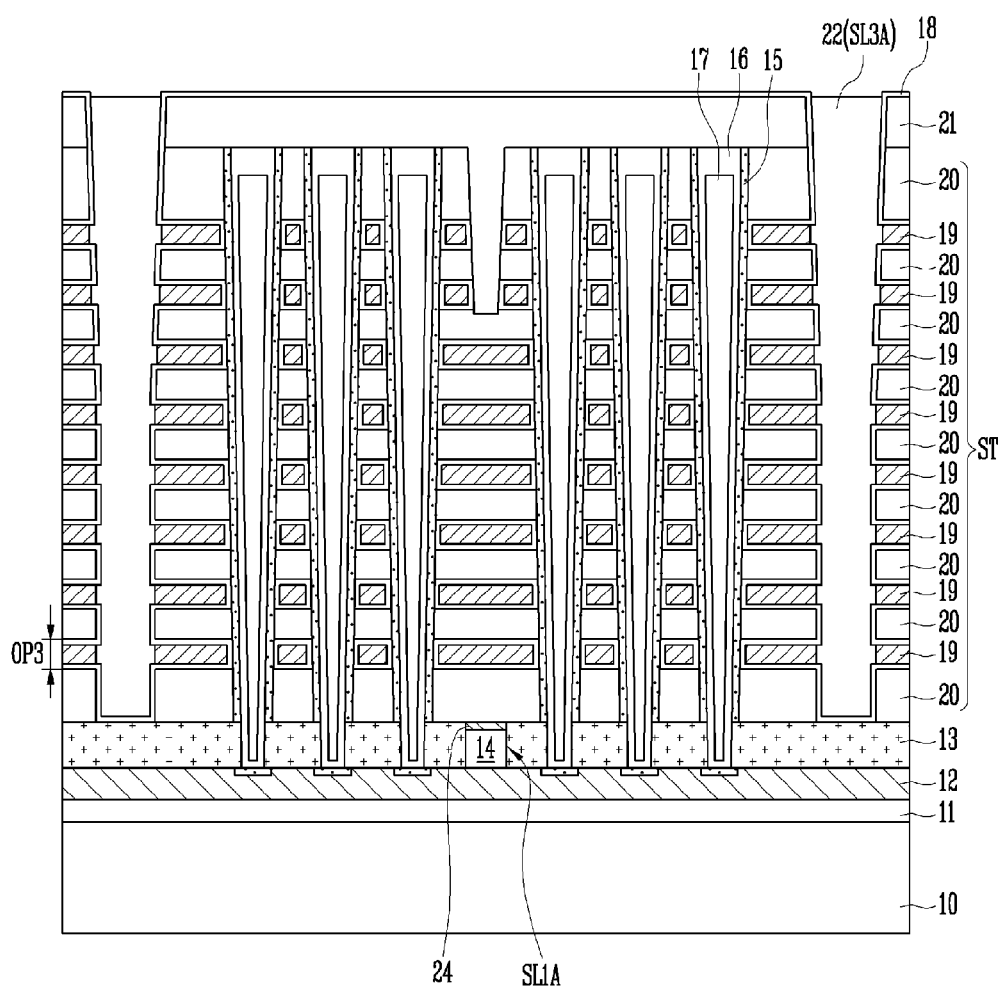

In FIG. 16, after the remaining protective layer 42 is removed, the third sacrificial layers 36 may be selectively removed through the third slits SL3A (SL3B in FIG. 12A) to form third openings OP3. Since the second insulating layers 20 may be supported by the channel layers 16 and the isolation insulating pattern 21, structural stability may be increased.

In addition, according to the above-described uneven structure, since some of the second insulating layers 20 which are located at the lower part of the stacked structure ST are selectively etched, the lower width of each of the third slits SL3A (SL3B in FIG. 12A) may be increased. Therefore, as compared to the initial structure of the third slits SL3A (SL3B in FIG. 12A) as shown in FIG. 12B, the width difference between the upper and lower portions of the final structure of the third slits SL3A may be reduced.

Subsequently, conductive layers 19 may be formed in the third openings OP3. For example, a conductive material may be formed on inner walls of the third slits SL3A (SL3B in FIG. 12A) and in the third openings OP3. Further, by removing the conductive material formed on the inner walls of the third slits SL3A (SL3B in FIG. 12A), the conductive layers 19 may be formed. The conductive layers 19 may be separated by the third slits SL3A (SL3B in FIG. 12A). Since the lower widths of the third slits SL3A (SL3B in FIG. 12A) are increased, the conductive material formed on the inner walls of the third slits SL3A (SL3B in FIG. 12A) may be easily removed, so that the conductive layers 19 may be easily separated by the third slits SL3A.

The conductive layers 19 may include tungsten (W). In addition, before the conductive layers 19 are formed in the third openings OP3, a second memory layer 18 or a barrier layer may be further formed in the third openings OP3. The barrier layer may include titanium (Ti), titanium nitride (TiN), tantalum (Ta), tantalum nitride (TaN), tungsten nitride (WNx), or the like.

Subsequently, a slit insulating layer 22 may be formed in each of the third slits SL3A (SL3B in FIG. 12A). The slit insulating layer 22 may include an oxide.

According to the above-described manufacturing method, the reinforcement pattern 14 may be formed in the first sacrificial layer 34. Therefore, the process for forming the second opening OP2, the process for removing the first memory layer 15, and the process for forming the second source layer 13 may be performed in the stabilized structure supported by the reinforcement pattern 14. In addition, by forming the isolation insulating pattern 21, upper selection gate electrodes may be easily isolated. Further, the process for removing the third sacrificial layers 36 may be performed in the stabilized structure supported by the isolation insulating pattern 21. In addition, by using the protective layer 42, the first memory layer 15 exposed through the second opening OP2 may be selectively removed. In addition, at the same time, the lower width of each of the third slits SL3A (SL3B in FIG. 12A) may be increased.

Figure 17A:
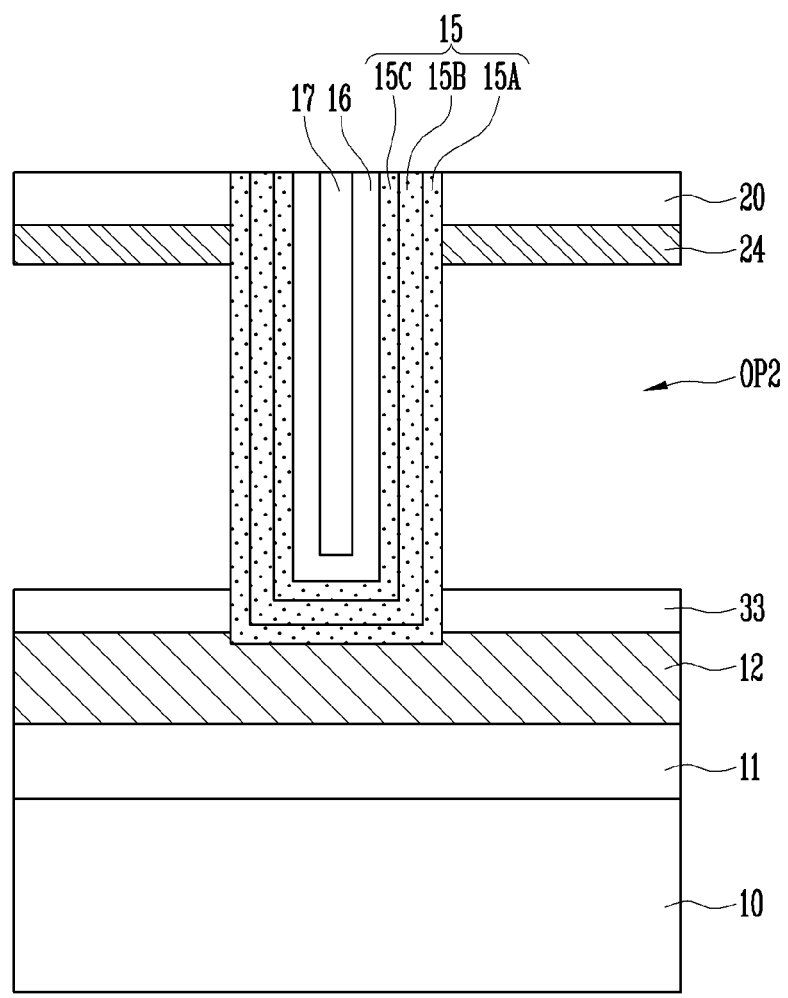
Figure 17B:
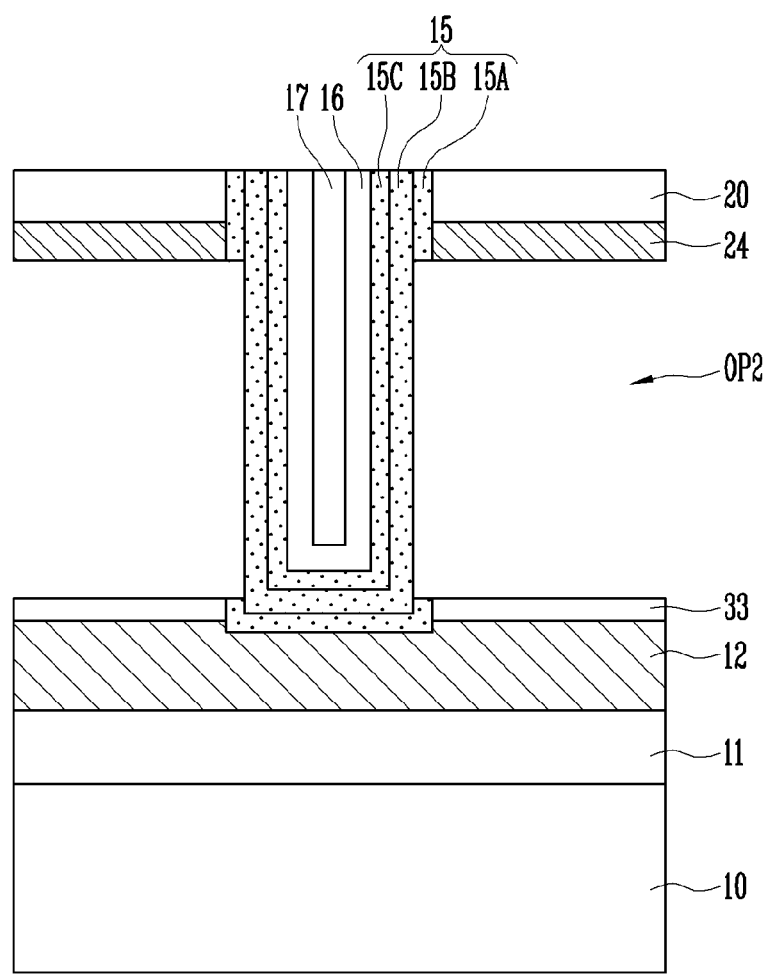
Figure 17D:
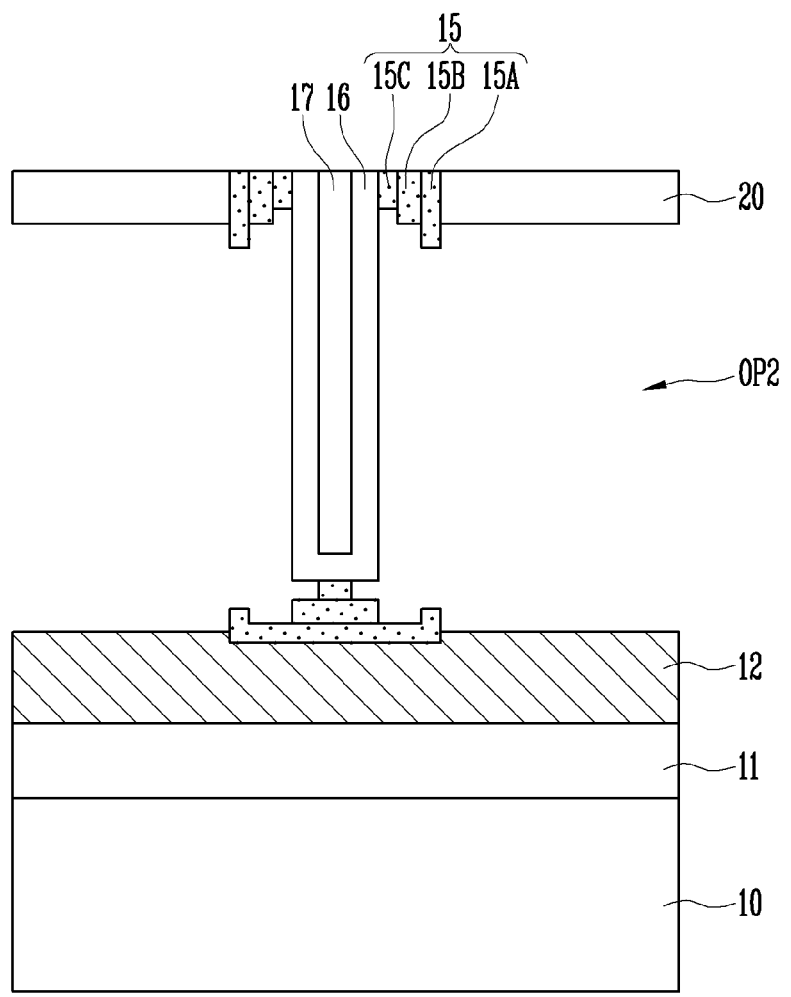

Referring to FIGS. 17A to 17D, partial enlarged views illustrating a method of manufacturing a semiconductor device according to an embodiment are illustrated. FIG. 17A is an enlarged view of an area D of FIG. 13. FIG. 17B to FIG. 17D are an enlarged views of the area D of FIG. 14. Sequential processes of removing a first memory layer are described below with reference to FIGS. 17A to 17D.

In FIG. 17A, the first memory layer 15 may include a tunnel insulating layer 15C surrounding the channel layer 16, a data storage layer 15B surrounding the tunnel insulating layer 15C, and a charge blocking layer 15A surrounding the data storage layer 15B. The tunnel insulating layer 15C and the charge blocking layer 15A may include an oxide. Further, the data storage layer 15B may include a nitride. In addition, the third sacrificial layers 36 may include a nitride, the second insulating layers 20 may include an oxide, the second sacrificial layer 33 may include an oxide, and the protective layer 42, as shown in FIGS. 13 to 15, may include a nitride.

When the second opening OP2 is formed, a portion of the charge blocking layer 15A, the etch barrier layer 24 and the second sacrificial layer 33 may be exposed through the second opening OP2. The etch barrier layer 24 may be formed to have a greater thickness than the data storage layer 15B so as not to be removed during an etch process of the data storage layer 15B. More specifically, the etch barrier layer 24 may be 2.5 times as thickness as the data storage layer 15B.

In FIG. 17B, the data storage layer 15B may be exposed by removing the charge blocking layer 15A exposed through the second opening OP2 by performing an etch process. The second sacrificial layer 33 exposed through the second opening OP2 and the second insulating layers 20 exposed in the lower portion of the third slit may be etched. In addition, a portion of the charge blocking layer 15A formed in the first source layer 12 or the second sacrificial layer 33 may remain.

Referring to FIG. 17C, by removing the data storage layer 15B exposed through the second opening OP2 by performing an etch process, the tunnel insulating layer 15C may be exposed. The etch barrier layer 24 may also be etched. When the thickness of the etch barrier layer 24 is similar to that of the data storage layer 15B, the etch barrier layer 24 may be removed to expose the bottom layer of the second insulating layers 20 during the etch process of the data storage layer 15B. As described above with reference to FIG. 17A, when the thickness of the etch barrier layer 24 is greater than that of the data storage layer 15B, the thickness of the etch barrier layer 24 may be reduced during the etch process of the data storage layer 15B. Even when the etch process of the data storage layer 15B is performed until the tunnel insulating layer 15C is exposed, the etch barrier layer 24, which has a relatively large thickness, may not be completely removed but remain to protect the bottom layer of the second insulating layers 20.

In addition, the protective layer 42 may also be etched by a predetermined thickness when the data storage layer 15B is etched. As a result, some of the third sacrificial layers 36 and second insulating layers 20 may be exposed through the lower portion of each of third slits by the etched protective layer 42. The thickness of the protective layer 42 may gradually decrease in a downward direction from the top portion of each of the third slits to the bottom portion thereof, toward the substrate 10. Therefore, when the protective layer 42 is etched, the third sacrificial layers 36 and the second insulating layers 20 may be sequentially exposed in a direction from lower layers arranged adjacent to the substrate 10. As a result, the lower layers of the third sacrificial layers 36 adjacent to the substrate 10 may be etched deeper than upper layers thereof to thereby form unevenness in the lower portion of each of the third slits.

Referring to FIG. 17D, the channel layer 16 may be exposed by removing the tunnel insulating layer 15C exposed through the second opening OP2 by performing an etch process. The remaining etch barrier layer 24 as shown in FIG. 17C may protect the bottom layer of the second insulating layers 20 when the tunnel insulating layer 15C is etched. Therefore, thickness loss of the bottom layer of the second insulating layers 20 may be prevented to maintain a target thickness. When the tunnel insulating layer 15C is etched, the second sacrificial layer 33, as shown in 17C, which is exposed through the second opening OP2 may be removed to expose the first source layer 12. In addition, when the tunnel insulating layer 15C is etched, a portion of the charge blocking layer 15A may be removed.

In addition, when the tunnel insulating layer 15C is etched, some of the second insulating layers 20 not covered by the protective layer 42 and are exposed through the lower portion of the third slit may be etched to a predetermined thickness. The etch barrier layer 24 as shown in FIG. 17C which remains after the tunnel insulating layer 15C is etched to expose the channel layer 16 may be removed. As a result, a bottom surface of the bottom layer of the second insulating layers 20 may be exposed.

When the above-described first memory layer 15 is etched, the second insulating layers 20 and the third sacrificial layers 36 which have different etch selectivities may be etched to different thicknesses. Therefore, after the first memory layer 15 is etched, the second insulating layers 20 and the third sacrificial layers 36 which remain in the lower portions of the third slits may define unevenness. The etched sidewalls of the third sacrificial layers 36 may protrude further toward the inside of each of the third slits than the etched sidewalls of the second insulating layers 20.

Referring to FIGS. 18 to 21, cross-sectional views illustrating a method of manufacturing a semiconductor device according to an embodiment, and that show a modified example of forming a protective layer are illustrated. Hereinafter, a description of common contents with earlier described embodiments is omitted.

Figure 18:
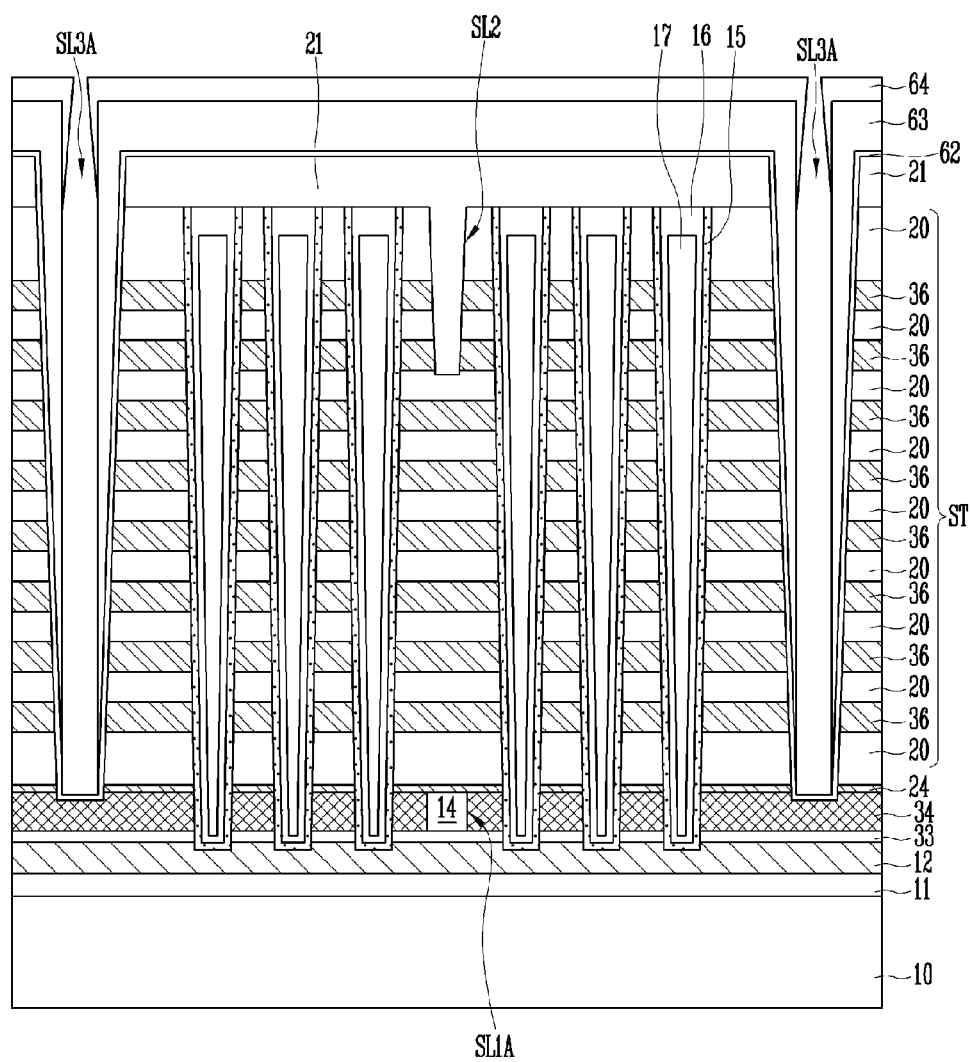
FIGS. 18 to 21 are cross-sectional views illustrating a method of manufacturing a semiconductor device according to an embodiment.

In FIG. 18, a first insulating layer 11, a first source layer 12, a second sacrificial layer 33, a first sacrificial layer 34 and a reinforcement pattern 14 may be formed over a substrate 10. The stacked structure ST including third sacrificial layers 36 and second insulating layers 20 stacked alternately with each other may be formed thereon. Before the stacked structure ST is formed, the etch barrier layer 24 may be further formed. Subsequently, a memory layer 15, a channel layer 16 and a gap-filling insulating layer 17 may be formed thereon. Further, the second slit SL2 may be formed through the stacked structure ST from the top layer of the third sacrificial layers 36 which is the most distant from the substrate 10 to at least one remaining layer. The second slit SL2 may be filled with an isolation insulating pattern 21.

Subsequently, the third slit SL3A may be formed through the stacked structure ST and the etch barrier layer 24 to expose the first sacrificial layer 34. Protective layers 62, 63, and 64 may be formed in the third slit SL3A. For example, the first protective layer 62 having a uniform thickness may be formed on the surfaces of the third slit SL3A and the stacked structure ST. The first protective layer 62 may be a nitride layer formed by a deposition method having good step coverage, such as Low Pressure-Chemical Vapor Deposition (LP-CVD).

Accordingly, a second protective layer 63 which is tapered so that the thickness thereof gradually decreases from top to bottom, toward the substrate 10 may be formed on the first protective layer 62. The second protective layer 63 may be a nitride layer formed by a deposition method having poor step coverage, such as Plasma Enhanced-Chemical Vapor Deposition (PE-CVD). Subsequently, the third protective layer 64 having a high etch selectivity with respect to the first and second protective layers 62 and 63 may be formed on the second protective layer 63. The third protective layer 64 may be a titanium nitride (TiN) layer formed by a Physical Vapor Deposition (PVD) method. By the PVD method, the third protective layer 64 may be formed to have an overhang shape over the stacked structure ST, and include an opening through which the third slit SL3A is opened.

Figure 19:
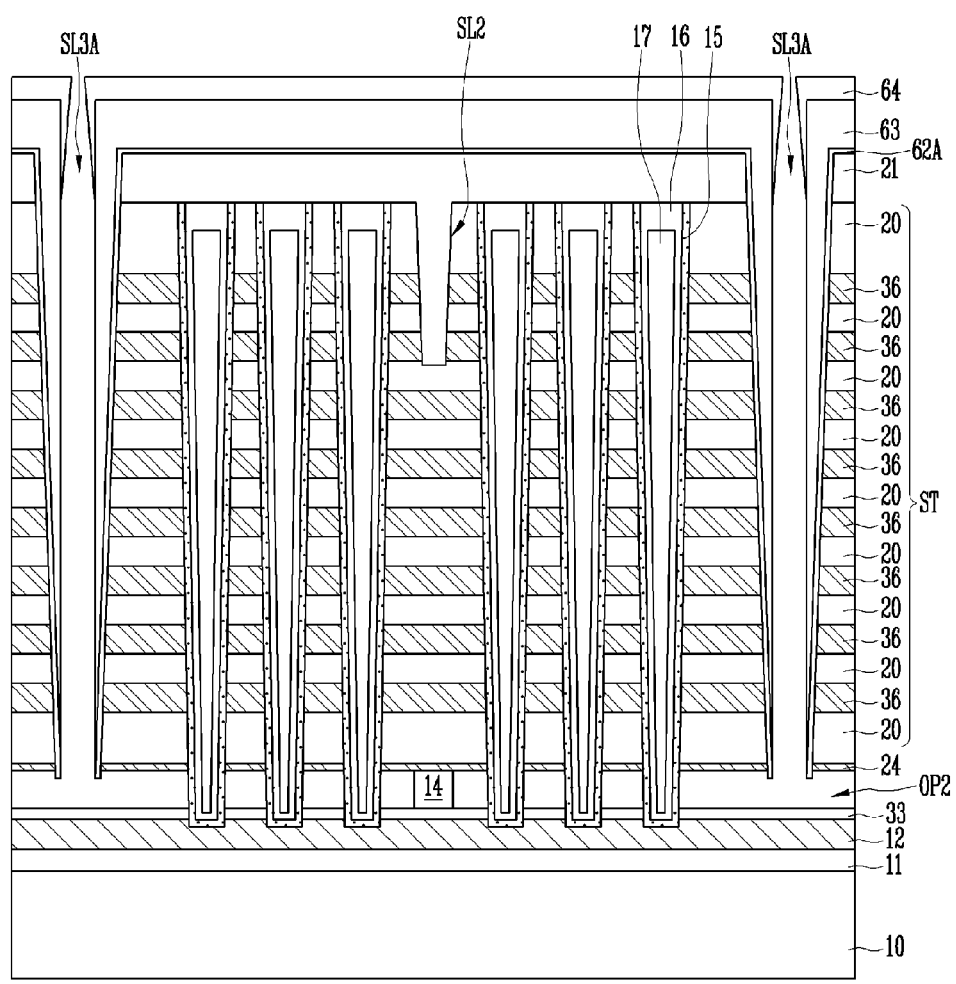

Referring to FIG. 19, the first protective layer 62 formed at a bottom surface of the third slit SL3A may be removed to expose the first sacrificial layer 34. A portion of the first protective layer 62 formed at the bottom surface of the third slit SL3A and is not covered by the third protective layer 64 may be exposed. Further, a portion of the first protective layer 62 formed on the sidewall of the third slit SL3A may be protected by the third protective layer 64. Therefore, when an etch process is performed to remove the first protective layer 62, a portion of the first protective layer 62 not covered by the third protective layer 64 may be removed. The first and second protective layers 62 and 63 which are formed on the sidewall of the third slit SL3A and the upper part of the stacked structure ST may be protected by the third protective layer 64. As a result, a first protective layer pattern 62A which has a shape of a spacer may be formed on the sidewall of the third slit SL3A.

Subsequently, the first sacrificial layer 34 may be removed by an etch process using the first protective layer pattern 62A and the second and third protective layers 63 and 64 as an etch barrier, so that the second opening OP2 may be formed and a portion of the memory layer 15 may be exposed through the second opening OP2.

Figure 20:
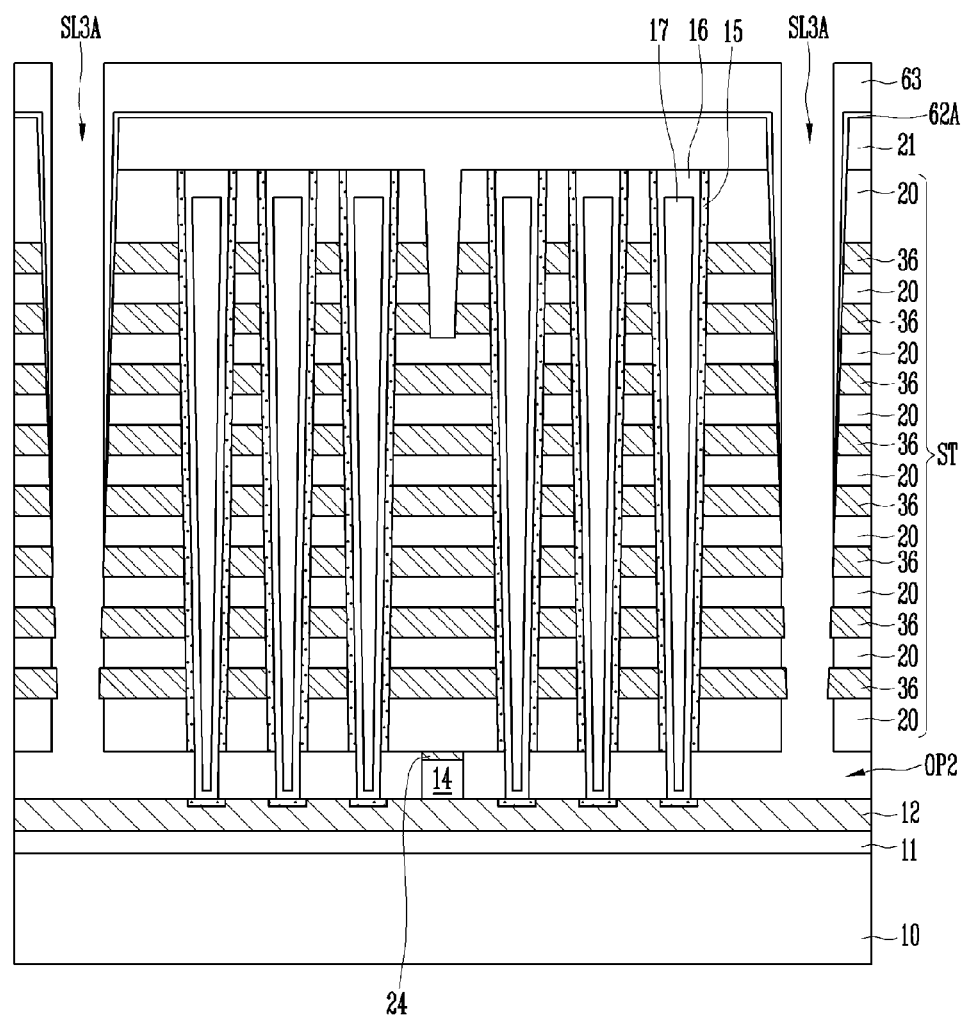

Referring to FIG. 20, the first memory layer 15 exposed through the second opening OP2 may be removed to expose the channel layer 16.

For example, when the first memory layer 15 includes a tunnel insulating layer, a data storage layer and a charge blocking layer, the charge blocking layer exposed through the second opening OP2 may be removed first. The second sacrificial layer 33 exposed through the second opening OP2 may be partially removed. Further, the third protective layer 64 may be removed. Subsequently, the data storage layer exposed through the second opening OP2 may be removed. The etch barrier layer exposed through the second opening OP2 may also be removed. In addition, the first protective layer pattern 62A and the second protective layer 63 may be partially removed. Therefore, the third sacrificial layers 36 and the second insulating layers 20 may be exposed through the lower portion of the third slit SL3A which is adjacent to the substrate 10. The exposed third sacrificial layers 36 may be partially removed. Subsequently, the tunnel insulating layer exposed through the second opening OP2 may be removed. The second sacrificial layer 33 exposed through the second opening OP2 may be removed to expose the first source layer 12. In addition, the second insulating layers 20 exposed through the lower portion of the third slit SL3A may be partially removed to form unevenness in the lower portion of the third slit SL3A.

Figure 21:
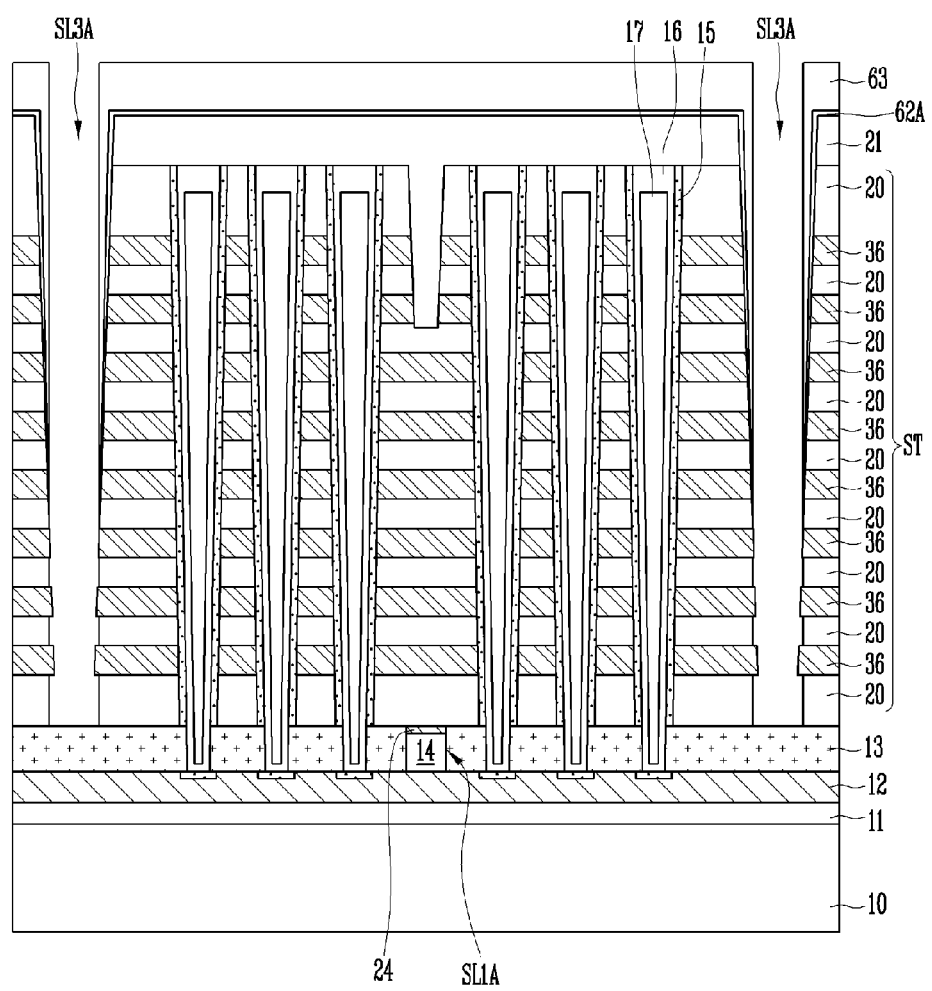

Referring to FIG. 21, a second source layer 13 which is electrically coupled to a portion of the channel layer 16 exposed through the second opening OP2 may be formed. Subsequent processes may be performed in substantially the same manner as described above with reference to FIG. 16.

According to the above-described processes, the plurality of protective layers 62 to 64 may be formed by combining various deposition methods and then used as an etch barrier to etch the first memory layer 15. Therefore, the first memory layer 15 may be selectively removed. Further, a lower width of the third slit SL3A may be increased.

Referring to FIGS. 22 to 25, cross-sectional views illustrating a method of manufacturing a semiconductor device according to an embodiment, and that show a modified example of forming a protective layer are illustrated. Hereinafter, a description of common contents with earlier described embodiments is omitted.

Figure 22:
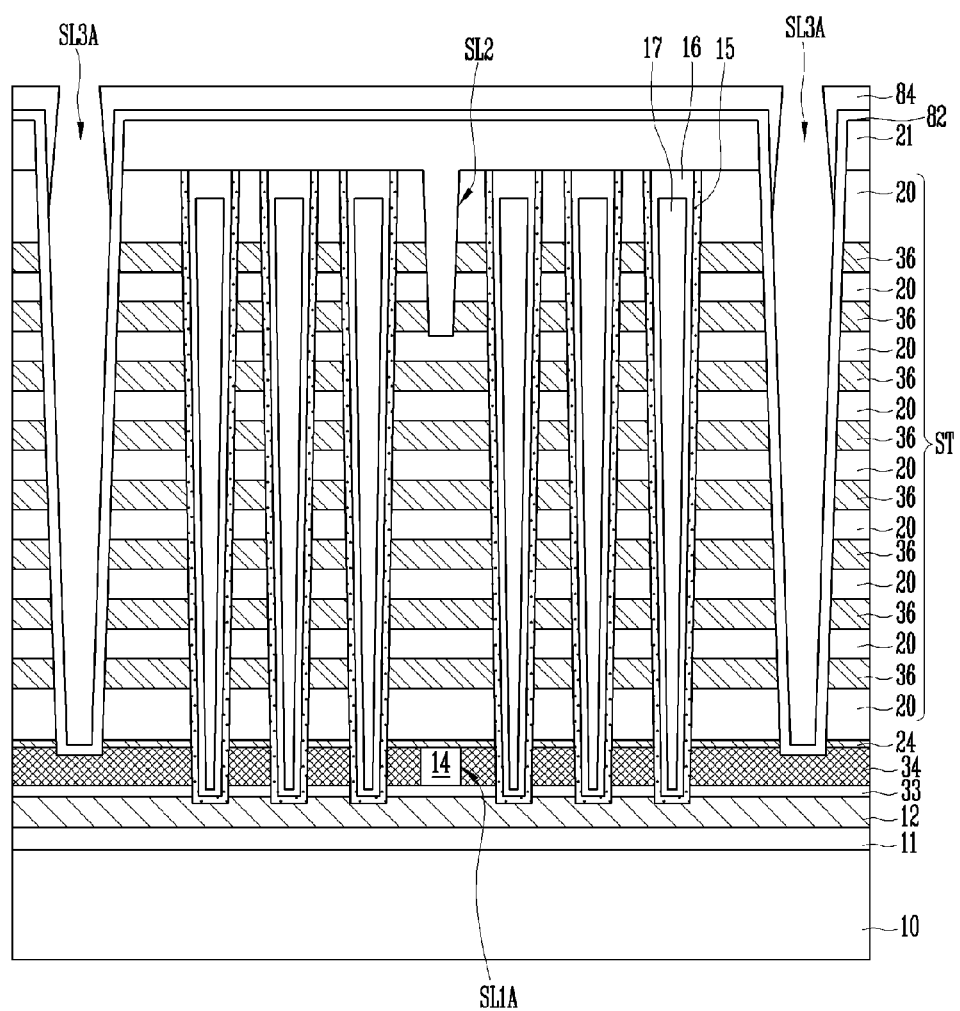
FIGS. 22 to 25 are cross-sectional views illustrating a method of manufacturing a semiconductor device according to an embodiment.

In FIG. 22, a first insulating layer 11, a first source layer 12, a second sacrificial layer 33, a first sacrificial layer 34 and a reinforcement pattern 14 may be formed over a substrate 10. The stacked structure ST including third sacrificial layers 36 and second insulating layers 20 stacked alternately with each other may be formed thereon. Before the stacked structure ST is formed, the etch barrier layer 24 may be further formed. Subsequently, after a first memory layer 15, a channel layer 16 and a gap-filling insulating layer 17 are formed, the second slit SL2 and an isolation insulating pattern 21 may be formed.

The third slit SL3A may be formed through the stacked structure ST and the etch barrier layer 24 to expose the first sacrificial layer 34. Protective layers 82 and 84 may be formed in the third slit SL3A. For example, the first protective layer 82 having a uniform thickness may be formed on the surfaces of the third slit SL3A and the stacked structure ST. The first protective layer 82 may be a nitride layer formed by a deposition method having good step coverage, such as Low Pressure-Chemical Vapor Deposition (LP-CVD). In addition, the first protective layer 82 may have a greater thickness than the first protective layer 62 described above with reference to FIG. 18. Subsequently, a second protective layer 84 having a high etch selectivity with respect to the first protective layer 82 may be formed on the first protective layer 82. The second protective layer 84 may be a titanium nitride (TiN) layer formed by a Physical Vapor Deposition (PVD) method. By the PVD method, the second protective layer 84 may be formed to have an overhang over the stacked structure ST, and include an opening through which the third slit SL3A is opened.

Figure 23:
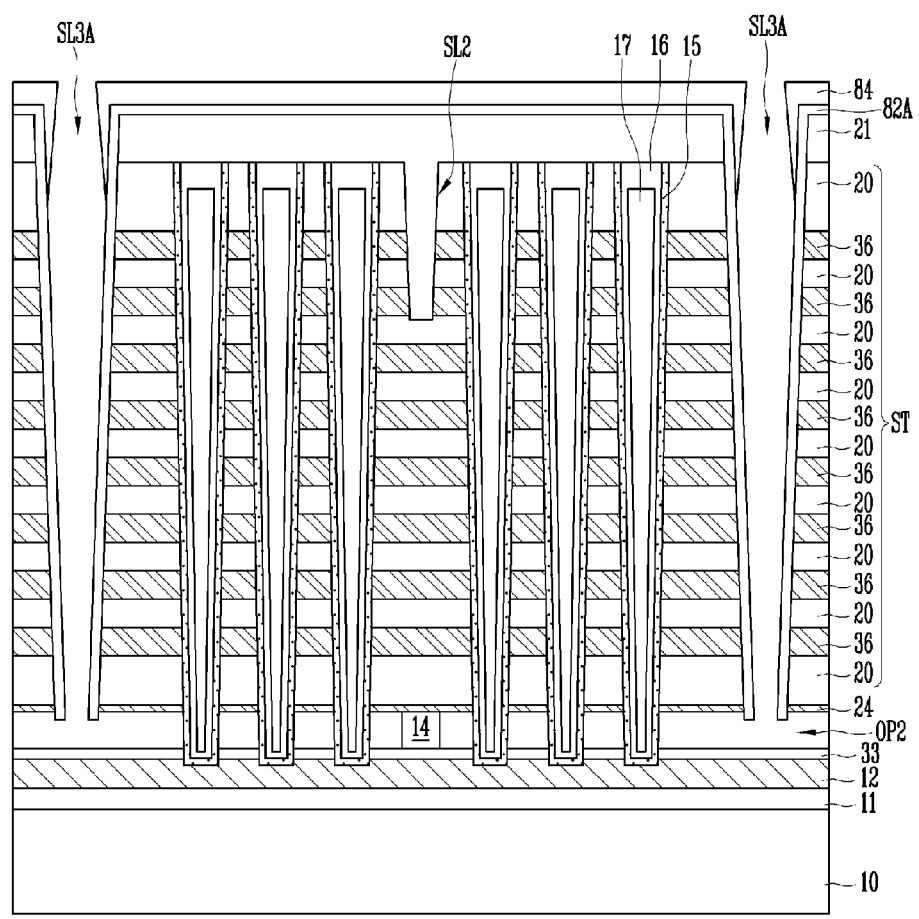

In FIG. 23, the first protective layer 82 which is formed at the bottom surface of the third slit SL3A may be removed to expose the first sacrificial layer 34, so that a first protective layer pattern 82A having a shape of a spacer may be formed on the sidewall of the third slit SL3A.

Subsequently, the first sacrificial layer 34 may be removed by performing an etch process using the first protective layer pattern 82A and the second protective layer 84 as an etch barrier, so that the second opening OP2 may be formed and a portion of the first memory layer 15 may be exposed through the second opening OP2.

Figure 24:
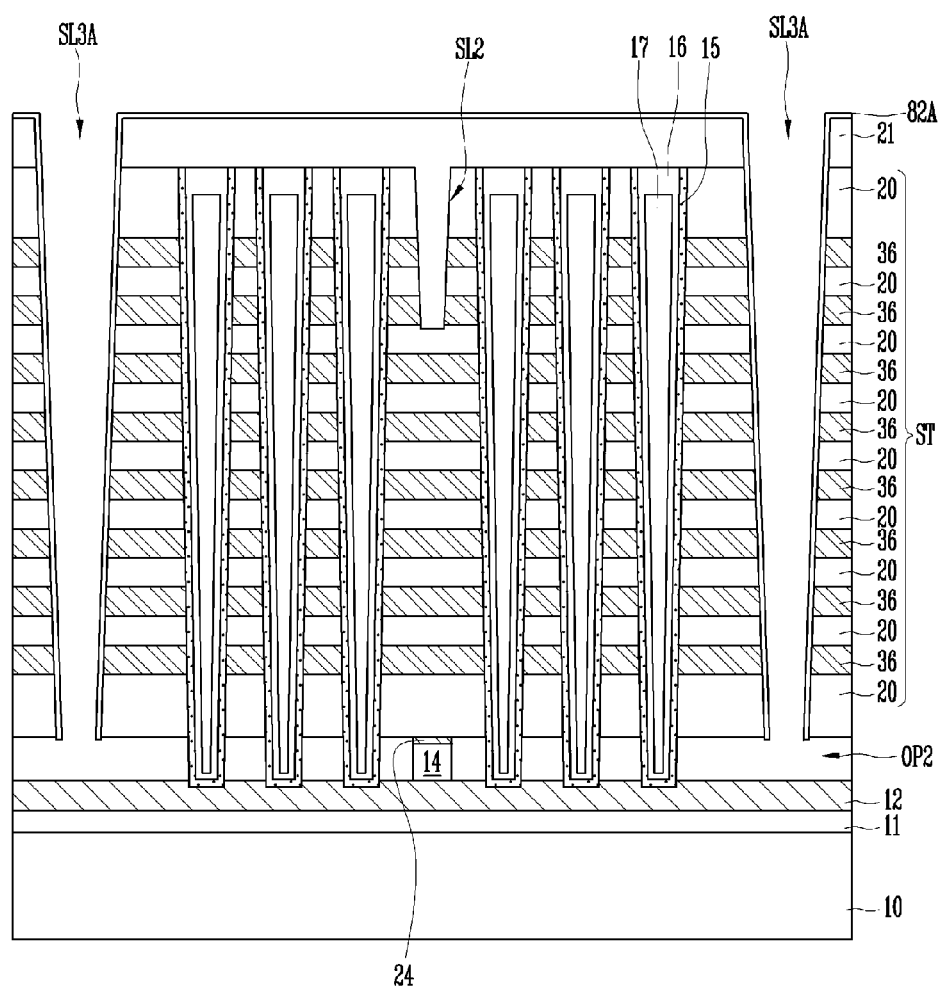

In FIG. 24, the first memory layer 15 exposed through the second opening OP2 may be removed to expose the channel layer 16.

For example, when the first memory layer 15 includes a tunnel insulating layer, a data storage layer and a charge blocking layer, the charge blocking layer exposed through the second opening OP2 may be removed first. At this time, the second sacrificial layer 33 exposed through the second opening OP2 may be partially exposed. Further, the second protective layer 84 may be removed. Subsequently, the data storage layer exposed through the second opening OP2 may be removed by an etch process. A portion of the etch barrier layer 24 may also be removed through the second opening OP2. When the etch barrier layer 24 has a greater thickness than the data storage layer, the etch barrier layer 24 may not be completely removed but protect a bottom layer of the second insulating layers 20 which is the closest to the substrate 10 while the data storage layer is etched to expose the tunnel insulating layer.

In addition, the first protective layer pattern 82A may be partially removed. The first protective layer pattern 82A may be so thick that the first protective layer pattern 82A may remain with a reduced thickness. Therefore, the third sacrificial layers 36 and the second insulating layers 20 may not be exposed through the third slit SL3A and be protected by a first protective layer pattern 84A. Subsequently, the tunnel insulating layer exposed through the second opening OP2 may be removed. The second sacrificial layer 33 exposed through the second opening OP2 may be removed to expose the first source layer 12. In addition, the remaining etch barrier layer 24 may protect the bottom layer of the second insulating layers 20 when the tunnel insulating layer is etched. Therefore, the thickness of the bottom layer of the second insulating layers 20 may be maintained. The remaining etch barrier layer 24 may be removed through the second opening OP2 after the tunnel insulating layer is etched to expose the channel layer 16.

Figure 25:
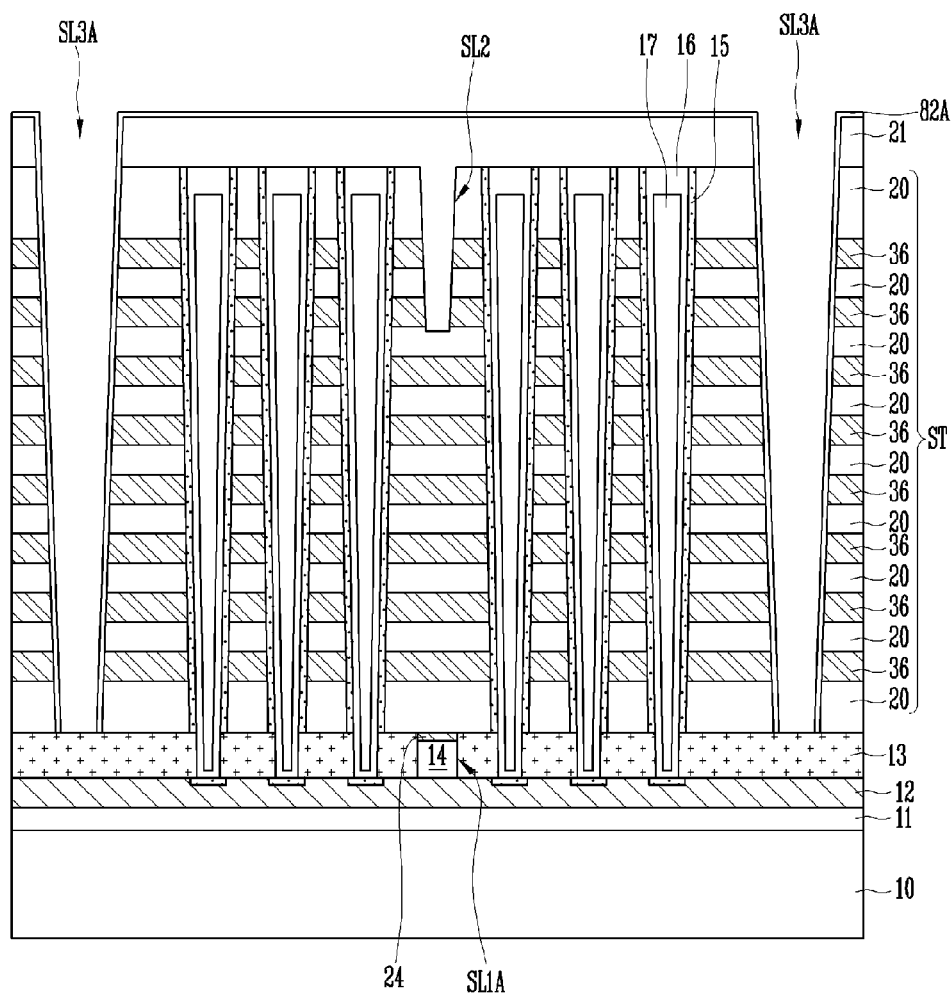

In FIG. 25, the second source layer 13 which electrically contacts a portion of the channel layer 16 exposed through the second opening OP2 may be formed. Subsequent processes may be performed in substantially the same manner as described above with reference to FIG. 16.

According to the above-described processes, the multi-layered protective layers 82 and 84 may be formed by combining various deposition methods and then used as an etch barrier to form the first memory layer 15. Therefore, the first memory layer 15 may be selectively removed.

Figure 26:
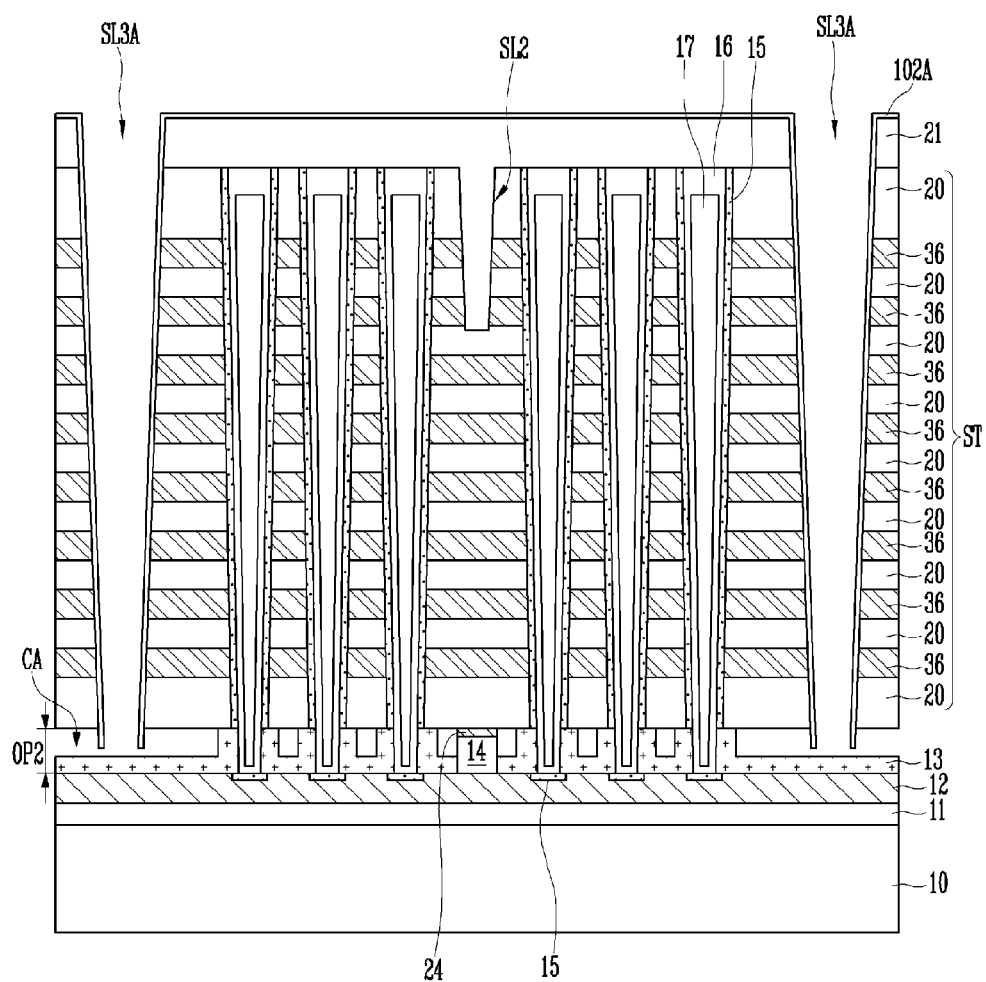
FIGS. 26 to 28 are cross-sectional views illustrating a method of manufacturing a semiconductor device according to an embodiment.
Figure 27:
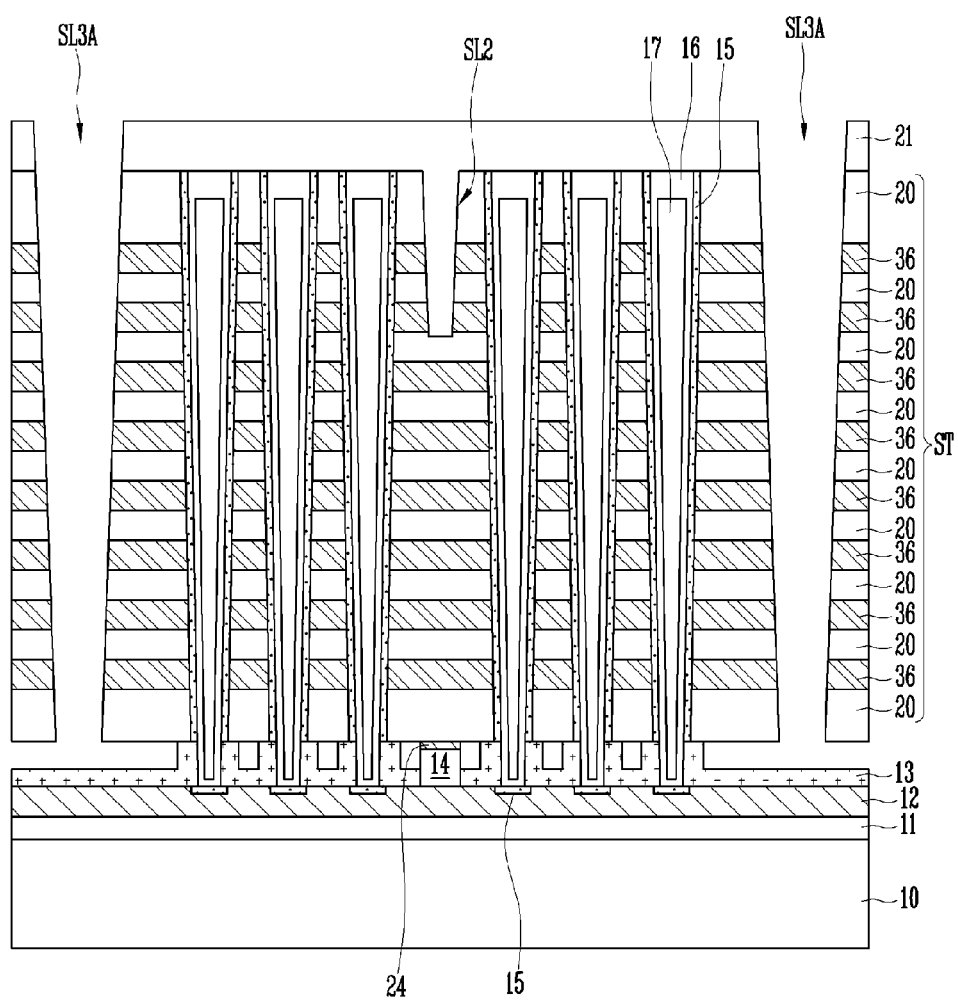
Figure 28:
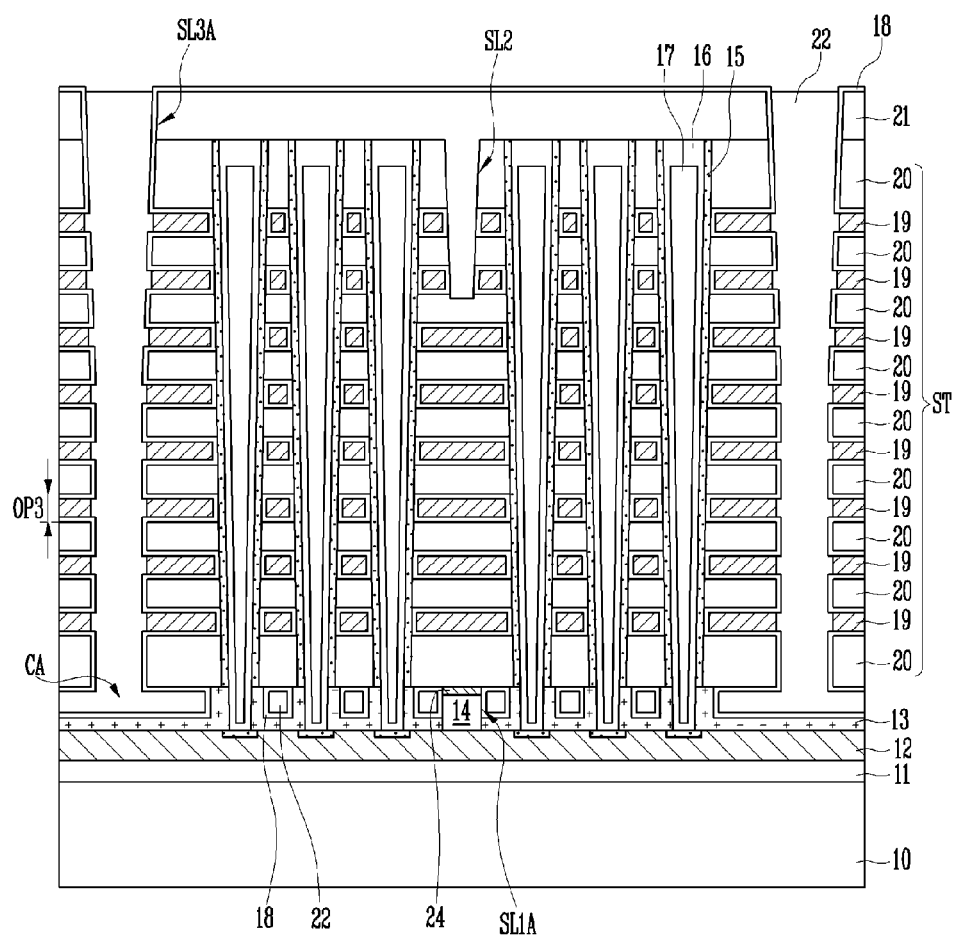

Referring to FIGS. 26 to 28, cross-sectional views illustrating a method of manufacturing a semiconductor device according to an embodiment, and that show a modified example of forming a second source layer are illustrated. Hereinafter, a description of common contents with earlier described embodiments is omitted.

In FIG. 26, a first insulating layer 11, a first source layer 12, and a stacked structure ST may be formed over a substrate 10. The stacked structure ST may include third sacrificial layers 36 and second insulating layers 20 stacked alternately with each other. A reinforcement pattern 14 may be formed between the first source layer 12 and the stacked structure ST. The etch barrier layer 24 may be further formed between the reinforcement pattern 14 and the stacked structure ST.

A through structure that includes a first memory layer 15 layer 15, a channel layer 16 and a gap-filling insulating layer 17 may pass through the stacked structure ST. The through structure may extend to the first source layer 12. The second slit SL2 may pass through the upper part of the stacked structure ST. The second slit SL2 may be completely filled with an isolation insulating pattern 21. Further, the isolation insulating pattern 21 may extend to cover the top surface of the stacked structure ST. The third slit SL3A may pass through the isolation insulating pattern 21 and the stacked structure ST. The sidewall of the third slit SL3A may be protected by the first protective layer pattern 102A.

The first protective layer pattern 102A may extend over a top surface of the isolation insulating pattern 21. The third slit SL3A may be connected to the second opening OP2. The second opening OP2 may be disposed between the stacked structure ST and the first source layer 12. The shape of the second opening OP2 may be maintained by the reinforcement pattern 14.

The etch barrier layer 24 may be removed through the second opening OP2, so that the etch barrier layer 24 may remain only over the reinforcement pattern 14. A portion of the first memory layer 15 layer 15 may be removed through the second opening OP2. Further, a lower portion of the channel layer 16 may be exposed through the second opening OP2.

The above-described structure may be formed by sequentially performing the processes described above with reference to FIGS. 22 to 24. After the above-described structure is formed, a second source layer 13 may be formed by growing silicon from the channel layer 16 and the first source layer 12 exposed through the second opening OP2. By controlling the thickness to which the second source layer 13 is grown, the second source layer 13 may extend to a predetermined thickness and may not completely fill the second opening OP2. The second source layer 13 may be formed on the exposed surfaces of the channel layer 16 and the first source layer 12 which are exposed through the second opening OP2, so that a concave portion CA may be formed in the surface of the second source layer 13. A depth of the concave portion CA may be greater than a thickness of each of the third sacrificial layers 36.

Referring to FIG. 27, the third sacrificial layers 36 may be exposed through the third slit SL3A by removing the first protective layer pattern 102A.

Referring to FIG. 28, the third sacrificial layers 36 may be removed through the third slit SL3A, so that the third openings OP3 may be formed between the second insulating layers 20. Subsequently, the third openings OP3 may be filled with a conductive material. The conductive material may include a low-resistance metallic material, such as tungsten (W). The conductive material may be formed on the sidewall of the third slit SL3A and the surface of the concave portion CA of the second source layer 13. Before the conductive material is formed, the second memory layer 18 or a barrier layer may be further formed. The barrier layer may include titanium (Ti), titanium nitride (TiN), tantalum (Ta), tantalum nitride (TaN), tungsten nitride (WNx), or the like.

Subsequently, conductive layers 19 may be formed by removing the conductive material formed on the sidewall of the third slit SL3A. The conductive layers 19 may be separated by the third slit SL3A and fill the third openings OP3. The conductive material may remain in the concave portion CA, or may be completely removed from the concave portion CA, depending on the area of the concave portion CA. For example, when the depth of the concave portion CA is greater than each of the thickness of the third sacrificial layer 36 and the thickness of the third opening OP3, the concave portion CA may not be completely filled with the conductive material. In addition, a very thin layer of the conductive material may be formed on the surface of the concave portion CA. In this example, by performing an etch process to remove the conductive material, the conductive material formed in the concave portion CA may be completely removed. Even when the conductive material remains in the concave portion CA, the remaining conductive material may be separated from the conductive layers 19 filling the third openings OP3. Therefore, the remaining conductive material may not affect driving.

Subsequently, a slit insulating layer 22 may be formed in the third slit SL3A. The slit insulating layer 22 may include an oxide. The slit insulating layer 22 may extend into the concave portion CA of the second source layer 13. The concave portion CA may be completely filled with the slit insulating layer 22, or include a gap as described above with FIG. 7.

Figure 29:
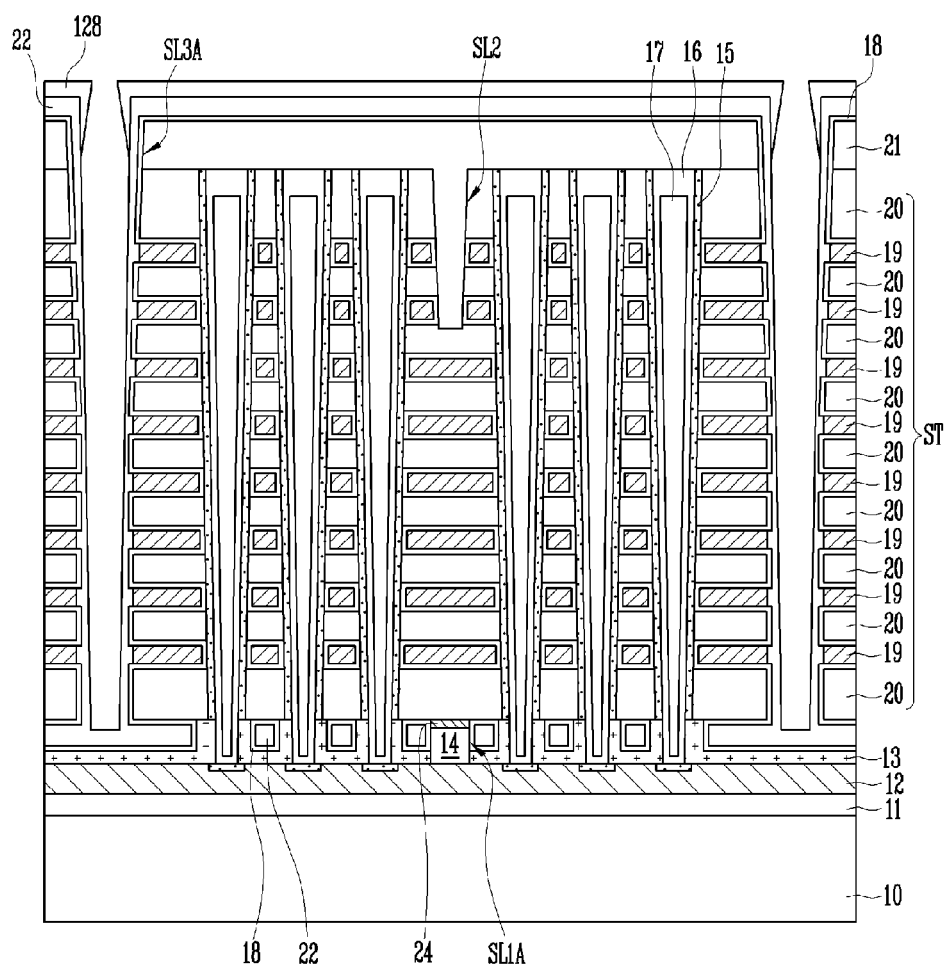
FIGS. 29 to 31 are cross-sectional views illustrating a method of manufacturing a semiconductor device according to an embodiment.
Figure 30:
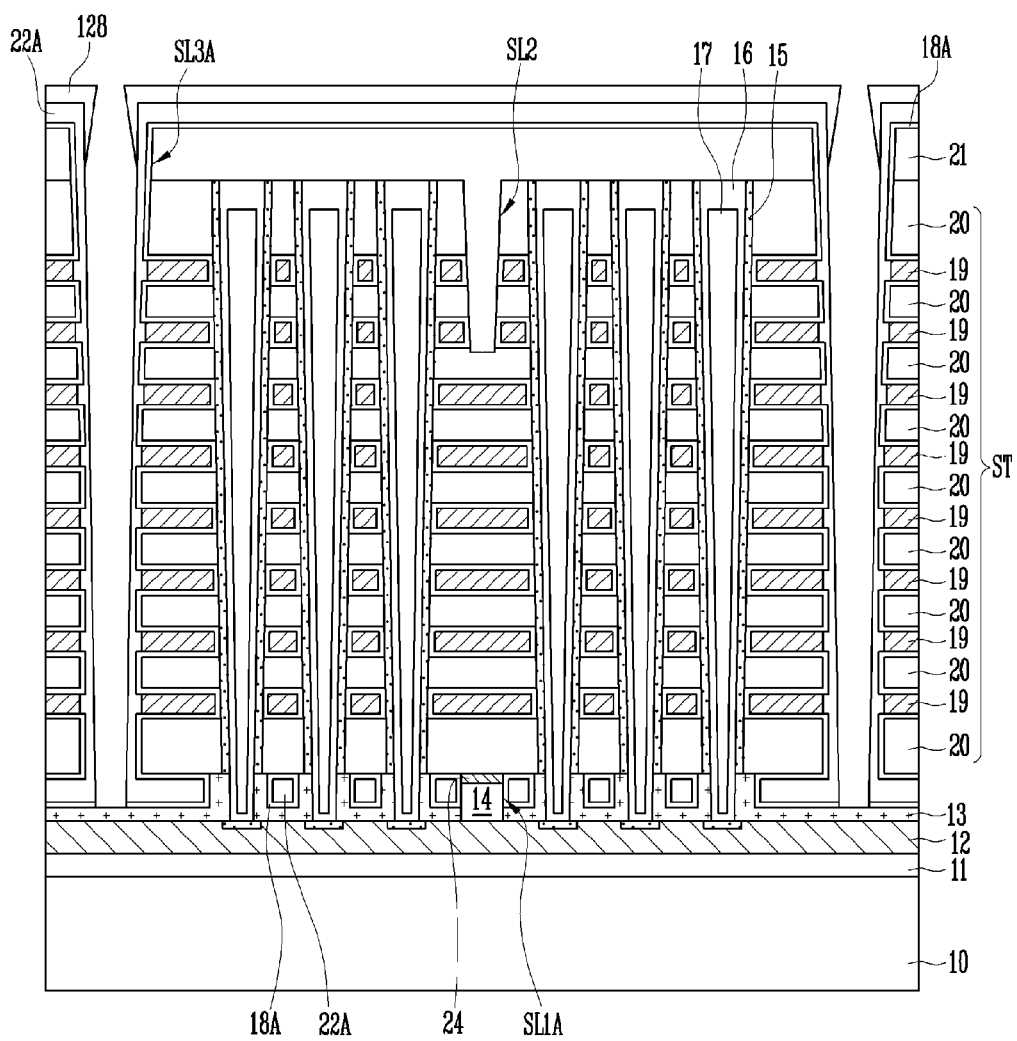
Figure 31:
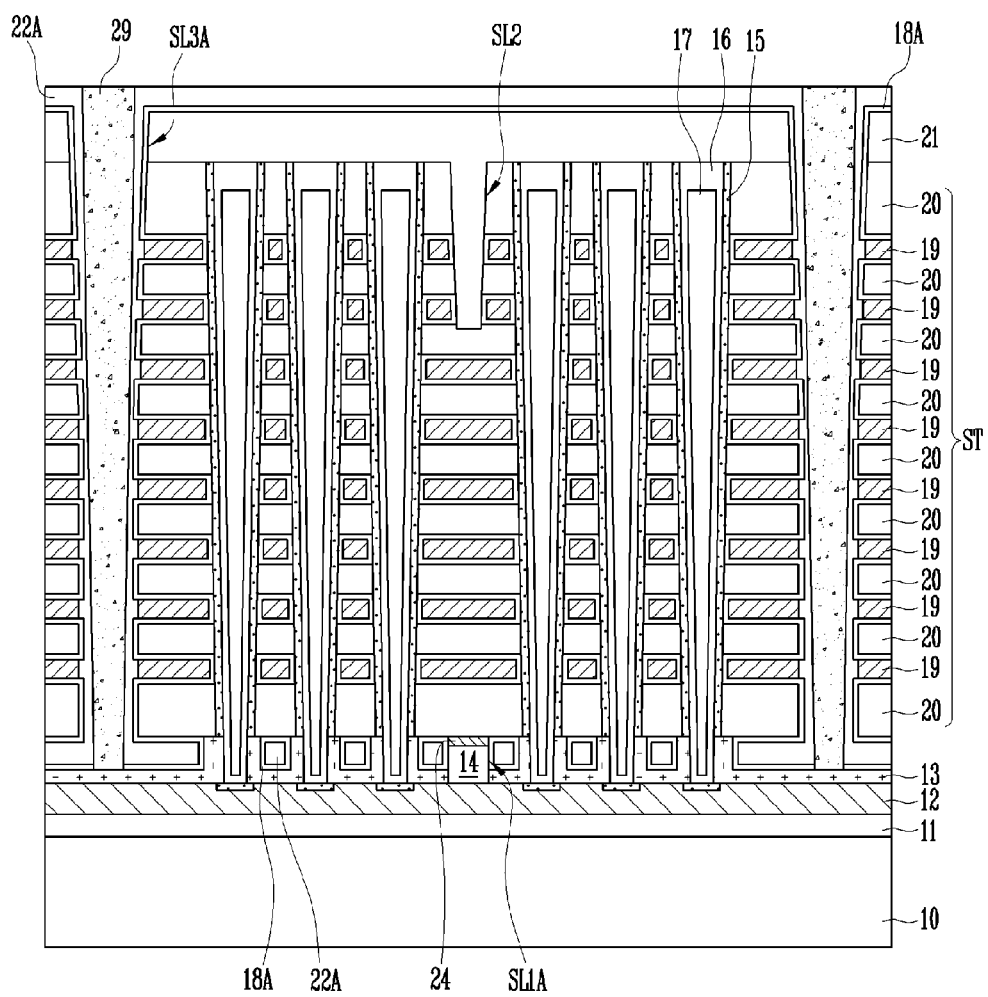

Referring to FIGS. 29 to 31, cross-sectional views illustrating a method of manufacturing a semiconductor device according to an embodiment, and that show a modified example of forming a slit insulating layer are illustrated. Hereinafter, a description of common contents with earlier described embodiments is omitted.

In FIG. 29, a first insulating layer 11, a first source layer 12 and the stacked structure ST may be formed over a substrate 10. The stacked structure ST may include second insulating layers 20 and conductive layers 16 stacked alternately with each other. A reinforcement pattern 14 may be formed between the first source layer 12 and the stacked structure ST. The etch barrier layer 24 may be formed on the reinforcement pattern 14. A gap between the stacked structure ST and the first source layer 12 may be maintained by the reinforcement pattern 14.

A through structure including the first memory layer 15, the channel layer 16 and a gap-filling insulating layer 17 may pass through the stacked structure ST. The through structure may extend to the first source layer 12. The first memory layer 15 may be divided into a first portion remaining between the first source layer 12 and the channel layer 16 and a second portion remaining between the stacked structure ST and the channel layer 16. The first portion and the second portion may be separated from each other while interposing a gap maintained by the reinforcement pattern 14. A lower portion of the channel layer 16 may be exposed between the first portion and the second portion.

The second slit SL2 may pass through the upper part of the stacked structure ST. The second slit SL2 may be completely filled with an isolation insulating pattern 21. The isolation insulating pattern 21 may extend to cover the top surface of the stacked structure ST. The third slit SL3A may pass through the isolation insulating pattern 21 and the stacked structure ST.

The second source layer 13 may be formed on a surface of the lower portion of each channel layer 16 exposed between the first portion and the second portion of the first memory layer 15, and a surface of the first source layer 12. The concave portion CA may be formed in the surface of the second source layer 13.

The conductive layers 19 may be surrounded by the second memory layer 18. The second memory layer 18 may extend from the surfaces of the conductive layers 19 to the sidewall of the third slit SL3A. The second memory layer 18 may extend from the sidewall of the third slit SL3A to the surface of the concave portion CA of the second source layer 13. The second memory layer 18 may extend from the sidewall of the third slit SL3A to a top portion of the isolation insulating pattern 21.

The above-described structure may be formed using the processes described above with reference to FIGS. 26 to 28.

After the above-described structure is formed, a slit insulating layer 22 may be formed on the surface of the third slit SL3A and the surface of the concave portion CA. According to an embodiment, the slit insulating layer 22 may have a smaller thickness than the slit insulating layer described above with reference to FIG. 28, so that a central portion of the third slit SL3A may be opened. In other words, the third slit SL3A may not be completely filled with the slit insulating layer 22 and may have an opened central portion.

Subsequently, a protective layer 128 having a high etch selectivity with respect to the slit insulating layer 22 may be formed on the slit insulating layer 22. The protective layer 128 may include a titanium nitride (TiN) layer formed by a Physical Vapor Deposition (PVD) method. By the PVD method, the protective layer 128 may be formed to have an overhang structure. The protective layer 128 may also include an opening through which the third slit SL3A is opened.

Referring to FIG. 30, a portion of the slit insulating layer 22 and a portion of the second memory layer 18 which are formed at the bottom surface of the third slit SL3A may be removed to expose the second source layer 13. The portion of the slit insulating layer 22 and the portion of the second memory layer 18 which are not to be covered by the protective layer 128 and are exposed at the bottom surface of the third slit SL3A may be removed. The slit insulating layer 22 and the second memory layer 18 formed on the sidewall of the third slit SL3A and the top portion of the isolation insulating pattern 21 may be protected by the protective layer 128. Therefore, a slit insulating pattern 22A which has a shape of a spacer may be formed on the sidewall of the third slit SL3A. The slit insulating pattern 22A may remain under the stacked structure ST. In addition, the second memory layer 18 may be separated by the second memory layer patterns 18A.

Referring to FIG. 31, the protective layer 128 may be removed. Subsequently, the opened central portion of the third slit SL3A may be filled with a conductive material, such as metal. Further, the surface of the conductive material may be planarized by a planarization process, such as a Chemical Mechanical Polishing (CMP) process. The planarization process may be performed until the slit insulating pattern 22A is exposed. As a result, a common source line 29 which contacts the second source layer 13 may be formed in the third slit SL3A. The second memory layer patterns 18A may be separated by the common source line 29. In addition, the slit insulating pattern 22A may also be separated by the common source line 29.

Figure 32:
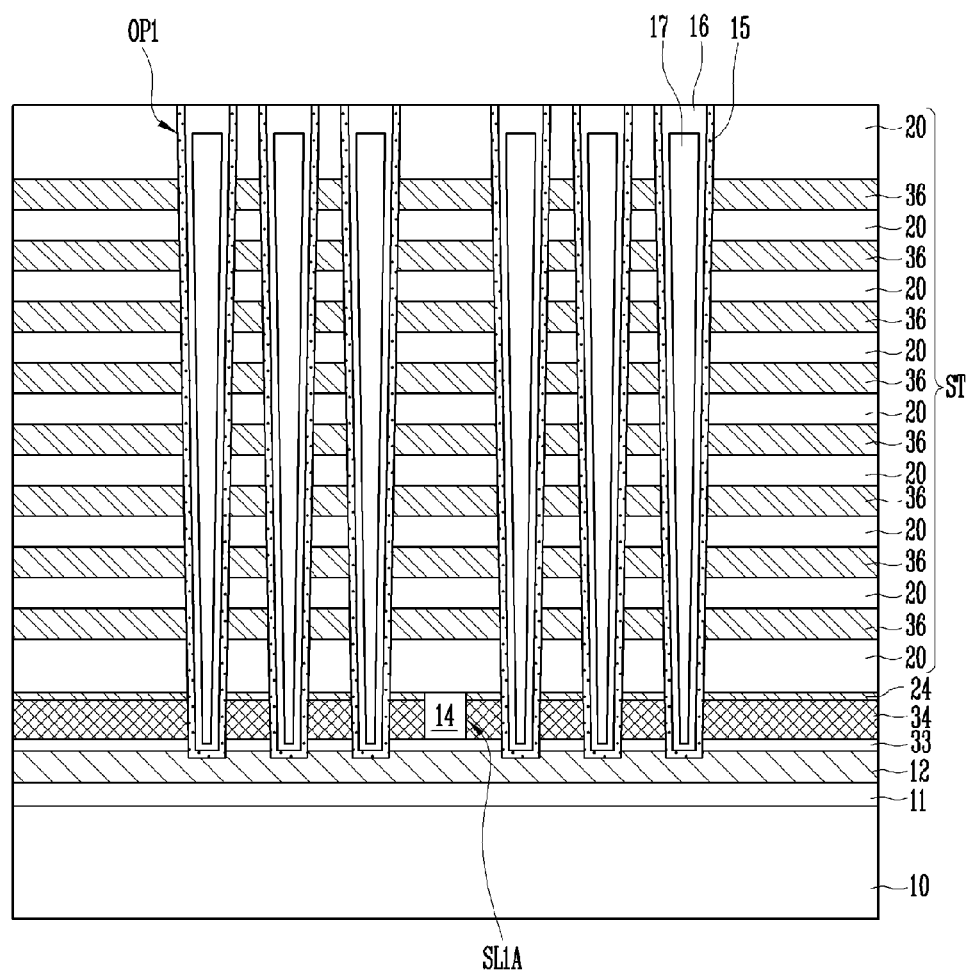
FIGS. 32 and 33 are cross-sectional views illustrating a method of manufacturing a semiconductor device according to an embodiment.
Figure 33:
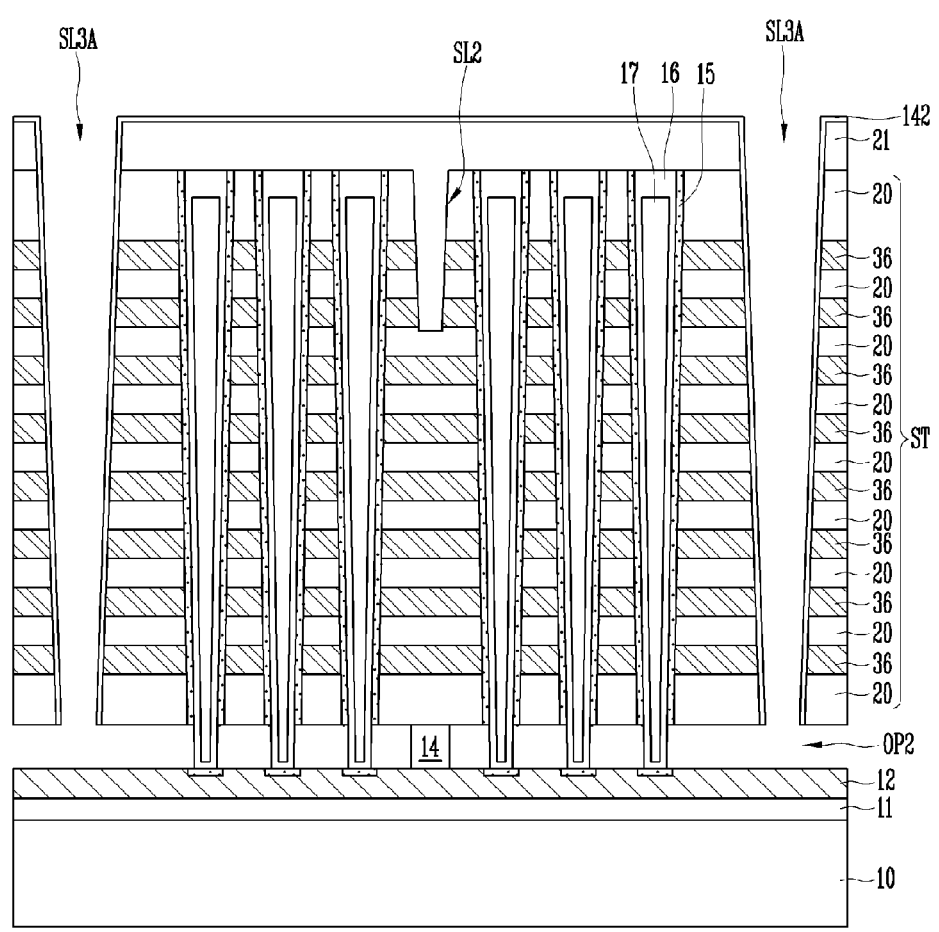

Referring to FIGS. 32 and 33, cross-sectional views illustrating a method of manufacturing a semiconductor device according to an embodiment, and that show a modified example of processes of forming an etch barrier layer and a reinforcement pattern are illustrated. Hereinafter, a description of common contents with earlier described embodiments is omitted.

In FIG. 32, a first insulating layer 11 may be formed on a substrate 10. Further, a first source layer 12 may be formed on the first insulating layer 11. The first source layer 12 may include a conductive layer including a doped polysilicon layer, a metal layer, and the like.

Subsequently, a first sacrificial layer 34 may be formed on the first source layer 12. Before the first sacrificial layer 34 is formed, the second sacrificial layer 33 may be further formed. The first sacrificial layer 34 may include a material having a high etch selectivity with respect to the second sacrificial layer 33. For example, the first sacrificial layer 34 may include an undoped polysilicon layer, a doped polysilicon layer, or the like, and the second sacrificial layer 33 may include an oxide or a nitride.

The etch barrier layer 24 may be formed on the first sacrificial layer 34. The etch barrier layer 24 may include a material having a high etch selectivity with respect to second insulating layers 20 to be described below in order to protect the second insulating layers 20. For example, the etch barrier layer 24 may include a nitride. The etch barrier layer 24 may have a greater thickness than the data storage layer of the first memory layers 15. For example, the etch barrier layer 24 may be 2.5 times as thick as the data storage layer.

Subsequently, the first slit SL1A may be formed through the first sacrificial layer 34 and the etch barrier layer 24. The reinforcement pattern 14 may be formed in the first slit SL1A. The first slit SL1A may be deep enough to pass through the first sacrificial layer 34 and the etch barrier layer 24 to expose the second sacrificial layer 33, the first source layer 12, or the first insulating layer 11. To form the reinforcement pattern 14, a process of filling the first slit SL1A with a reinforcement layer and a process of planarizing the reinforcement layer until the etch barrier layer 24 is exposed may be performed in a sequential manner. The reinforcement pattern 14 may be an insulating layer. When the etch barrier layer 24 has an etch selectivity with respect to the reinforcement layer, the etch barrier layer 24 may function as a planarization stop layer during the process of planarizing the reinforcement layer. The reinforcement layer may include an oxide having a high etch selectivity with respect to the etch barrier layer 24.

Subsequently, the stacked structure ST may be formed over the etch barrier layer 24 through which the reinforcement pattern 14 passes. As described above with reference to FIGS. 10A and 10B, the stacked structure ST may include third sacrificial layers 36 and second insulating layers 20 stacked alternately with each other.

Subsequently, the first openings OP1 may be formed through the stacked structure ST, the etch barrier layer 24 and the first sacrificial layer 34. The first openings OP1 may be formed using substantially the same processes as described above with reference to FIGS. 10A and 10B.

Subsequently, by performing the processes described above with reference to FIGS. 10A and 10B, the first memory layers 15, channel layers 16 and gap-filling insulating layers 17 may be formed in the first openings OP1. As described above with reference to FIG. 17A, each of the first memory layers 15 may include a tunnel insulating layer, a data storage layer and a charge blocking layer.

In FIG. 33, the second slit SL2 and an isolation insulating pattern 21 may be formed by using the processes described above with reference to FIGS. 11A and 11B. Subsequently, by using the processes described above with references to FIGS. 12A and 12B, the third slit SL3A may be formed through the stacked structure ST. Subsequently, the second opening OP2 may be formed by removing the first sacrificial layer 34 as shown in FIG. 32 through the third slit SL3A.

Subsequently, a protective layer 142 may be formed on the sidewall of the third slit SL3A. The protective layer 142 may be formed by using the process described above with reference to FIG. 13, the processes described above with reference to FIGS. 18 and 19, or the processes described above with reference to FIGS. 22 to 24.

After the protective layer 142 is formed, a portion of each of the first memory layers 15 exposed through the second opening OP2 may be removed to expose the channel layers 16 by using the processes described above with reference to FIGS. 17A to 17D. The etch barrier layer 24 as shown in FIG. 32 may remain to prevent thickness loss of the bottom second insulating layer 20 of the stacked structure ST. The etch barrier layer 24 as shown in FIG. 32 may be removed after the channel layers 16 is exposed.

Subsequently, a process of forming a second source layer, a process of forming a second memory layer, a process of forming conductive layers, a process of removing the protective layer 142, and a process of forming a slit insulating layer may be performed in a sequential manner. These processes may be performed according to one of the above-described embodiments.

For example, the process of forming a second source layer, the process of forming a second memory layer, the process of forming conductive layers, the process of removing the protective layer 142, and the process of forming a slit insulating layer may be performed by using the processes described above with reference to FIGS. 15 and 16.

In an example, the process of forming a second source layer, the process of forming a second memory layer, the process of forming conductive layers, the process of removing the protective layer 142, and the process of forming a slit insulating layer may be performed by using the processes described above with reference to FIG. 21.

In an example, the process of forming a second source layer, the process of forming a second memory layer, the process of forming conductive layers, the process of removing the protective layer 142, and the process of forming a slit insulating layer may be performed by using the processes described above with reference to FIG. 25.

In an example, the process of forming a second source layer, the process of forming a second memory layer, the process of forming conductive layers, the process of removing the protective layer 142, and the process of forming a slit insulating layer may be performed by using the processes described above with reference to FIGS. 26 to 28.

In an example, the process of forming a second source layer, the process of forming a second memory layer, the process of forming conductive layers, the process of removing the protective layer 142, and the process of forming a slit insulating layer may be performed by using the processes described above with reference to FIGS. 29 to 31. In this example, the process of forming a common source line as described above with reference to FIG. 31 may be further performed after the protective layer 142 is removed.

Figure 34:
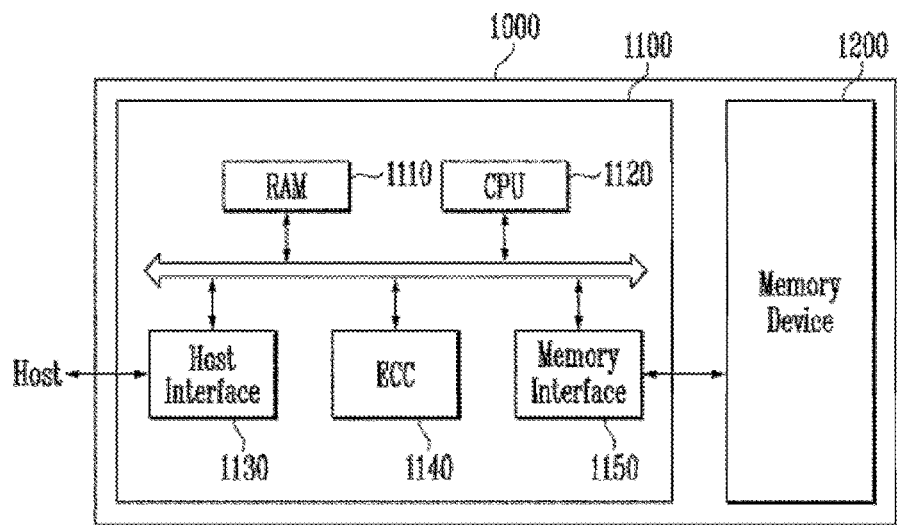
FIGS. 34 and 35 are block diagrams illustrating the configuration of a memory system according to an embodiment.

Referring to FIG. 34, a block diagram illustrating the configuration of a memory system according to an embodiment is described.

As illustrated in FIG. 34, a memory system 1000 according to an embodiment may include a memory device 1200 and a controller 1100.

The memory device 1200 may be used to store various types of data such as text, graphic, and software code. The memory device 1200 may be a non-volatile memory and include the structure described above and shown in FIGS. 1 to 33. The memory device 1200 may include a substrate in which a cell region and contact regions located at both sides of the cell region are defined. The memory device 1200 may also include a first source layer formed over the substrate; a second source layer formed over the first source layer; a reinforcement pattern formed in the second source layer; a stacked structure including conductive layers and insulating layers alternately stacked over the second source layer and the reinforcement pattern; channel layers passing through the stacked structure and the second source layer and electrically coupled to the source layer; and an isolation insulating pattern passing through at least one top conductive layer. Since the memory device 1200 is configured and manufactured in the above-described manner, a detailed description will be omitted.

The controller 1100 may be electrically coupled to a host and the memory device 1200. The controller 1100 may access the memory device 1200 in response to a request from the host. For example, the controller 1100 may control read, write, erase and background operations of the memory device 1200.

The controller 1100 may include a random access memory (RAM) 1110, a central processing unit (CPU) 1120, a host interface 1130, an error correction code (ECC) circuit 1140 and a memory interface 1150.

The RAM 1110 may function as an operation memory of the CPU 1120, a cache memory between the memory device 1200 and the host, and a buffer memory between the memory device 1200 and the host. The RAM 1110 may be replaced with a static random access memory (SRAM) or a read only memory (ROM).

The CPU 1120 may be configured to control the general operation of the controller 1100. For example, the CPU 1120 may be configured to operate firmware such as a flash translation layer (FTL) stored in the RAM 1110.

The host interface 1130 may interface with the host. For example, the controller 1100 may communicate with the host through various interface protocols including a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, an Integrated Drive Electronics (IDE) protocol, a private protocol, or a combination thereof.

The ECC circuit 1140 may detect and correct errors included in data, which is read from the memory device 1200, by using error correction codes (ECCs).

The memory interface 1150 may interface with the memory device 1200. For example, the memory interface 1150 may include a NAND interface or a NOR interface.

For example, the controller 1100 may further include a buffer memory configured to temporarily store data. The buffer memory may temporarily store data externally transferred through the host interface 1130. In the alternative, the buffer memory may temporarily store data transferred from the memory device 1200 through the memory interface 1150. The controller 1100 may further include a read only memory (ROM) storing code data to interface with the host.

Since the memory system 1000 according to an embodiment includes the memory device 1200 allowing for easy manufacture and having improved characteristics, characteristics of the memory system 1000 may also be improved.

Figure 35:
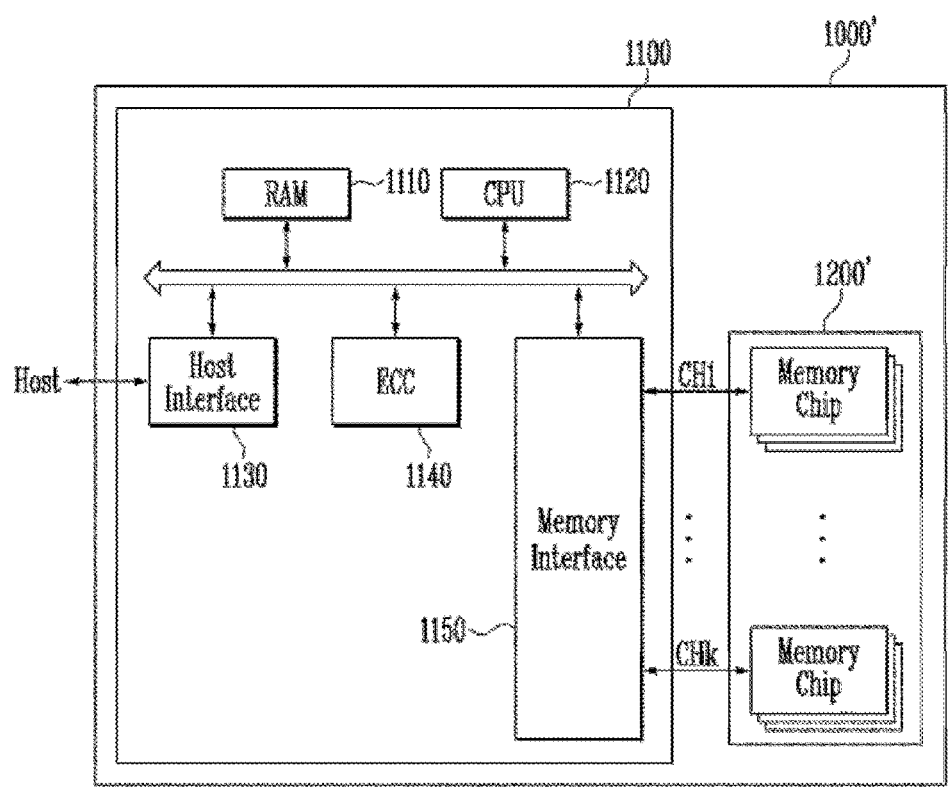

Referring to FIG. 35, a block diagram illustrating a memory system according to an embodiment is described. Hereinafter, descriptions of components already mentioned above are omitted.

As illustrated in FIG. 35, a memory system 1000' according to an embodiment may include a memory device 1200' and the controller 1100. The controller 1100 may include the RAM 1110, the CPU 1120, the host interface 1130, the ECC circuit 1140 and the memory interface 1150.

The memory device 1200' may be a non-volatile memory device. The memory device 1200' may include the memory string described above with reference to FIGS. 1 to 31. In addition, the memory device 1200' may include a cell region; a substrate in which a cell region and contact regions located at both sides of the cell region are defined; a first source layer formed over the substrate; a second source layer formed over the first source layer; a reinforcement pattern formed in the second source layer; a stacked structure including conductive layers and insulating layers alternately stacked over the second source layer and the reinforcement pattern; channel layers passing through the stacked body and the second source layer and electrically coupled to the second source layer; and an isolation insulating pattern passing through at least one top conductive layer. Since the memory device 1200' is configured and manufactured in the same manner as the memory device 1200, a detailed description thereof will be omitted.

The memory device 1200' may be a multi-chip package composed of a plurality of memory chips. The plurality of memory chips may be divided into a plurality of groups. The plurality of groups may communicate with the controller 1100 through first to k-th channels CH1 to CHk. In addition, memory chips included in a single group may be suitable for communicating with the controller 1100 through a common channel. The memory system 1000' may be modified so that a single memory chip may be electrically coupled to a single channel.

As described above, according to an embodiment, since the memory system 1000' includes the memory device 1200' which has an improved degree of integration, is easy to manufacture, and has improved characteristics, a degree of integration and characteristics of the memory system 1000' may also be improved. In addition, since the memory device 1200' is formed using a multi-chip package, data storage capacity and driving speed of the memory system 1000' may be further increased.

Figure 36:
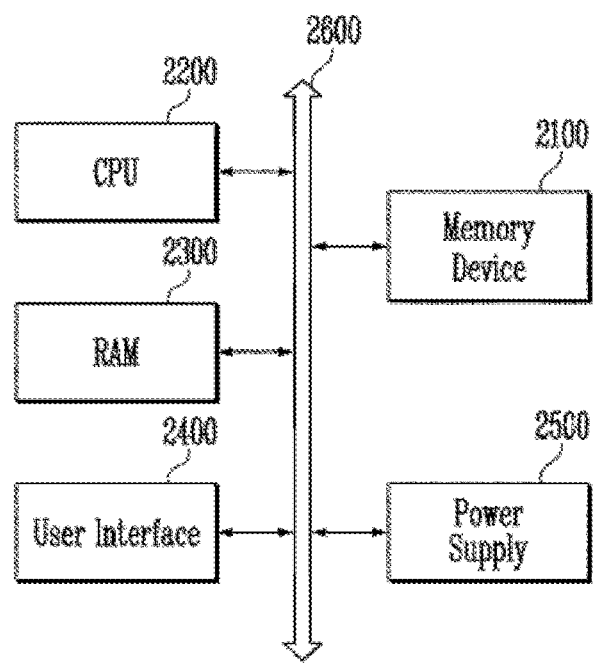
FIGS. 36 and 37 are block diagrams illustrating the configuration of a computing system according to an embodiment.

Referring to FIG. 36, a block diagram illustrating a computing system according to an embodiment is described. Hereinafter, descriptions of components already mentioned above are omitted.

As illustrated in FIG. 36, a computing system 2000 according to an embodiment may include a memory device 2100, a CPU 2200, a random-access memory (RAM) 2300, a user interface 2400, a power supply 2500 and a system bus 2600.

The memory device 2100 may store data, which is input through the user interface 2400, and data, which is processed by the CPU 2200. The memory device 2100 may be electrically coupled to the CPU 2200, the RAM 2300, the user interface 2400, and the power supply 2500. For example, the memory device 2100 may be electrically coupled to the system bus 2600 through a controller or be directly electrically coupled to the system bus 2600. When the memory device 2100 is directly electrically coupled to the system bus 2600, functions of the controller may be performed by the CPU 2200 and the RAM 2300.

The memory device 2100 may be a non-volatile memory. The memory device 2100 may include the memory string described above with reference to FIGS. 1 to 33. The memory device 2100 may include a substrate in which a cell region and contact regions located at both sides of the cell region are defined; a first source layer formed over the substrate; a second source layer over the source layer; a reinforcement pattern formed in the second source layer; a stacked body including conductive layers and insulating layers alternately stacked over the second source layer and the reinforcement pattern; channel layers passing through the stacked structure and the second source layer and electrically coupled to the second source layer; and an isolation insulating pattern passing through at least one top conductive layer. Since the memory device 2100 is configured and manufactured in the same manner as the memory devices 1200 or 1200', a detailed description thereof will be omitted.

In addition, as described above with reference to FIG. 35, the memory device 2100 may be a multi-chip package composed of a plurality of memory chips.

The computing system 2000 having the above-described configuration may be one of various components of an electronic device, such as a computer, an ultra-mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environments, one of various electronic devices for home networks, one of various electronic devices for computer networks, one of various electronic devices for telematics networks, an RFID device, and/or one of various devices for computing systems, etc.

As described above, since the computing system 2000 according to an embodiment includes the memory device 2100 which has an improved degree of integration, is easy to manufacture, and has improved characteristics, data storage capacity and characteristics of the computing system 2000 may be improved.

Figure 37:
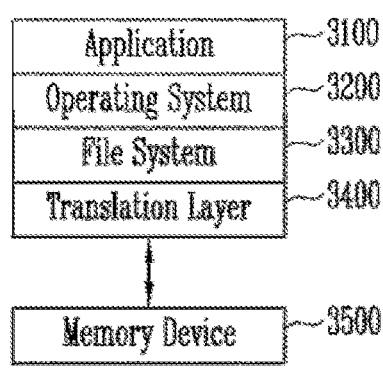

Referring to FIG. 37, a block diagram illustrating a computing system according to an embodiment is described.

As illustrated in FIG. 37, a computing system 3000 according to an embodiment may include a software layer that has an operating system 3200, an application 3100, a file system 3300, and a translation layer 3400. The computing system 3000 may include a hardware layer such as a memory system 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data and store them in the memory device 3500 according to given rules. The file system 3300 may be determined depending on the operating system 3200 that is used in the computing system 3000. For example, when the operating system 3200 is a Microsoft Windows-based system, the file system 3300 may be a file allocation table (FAT) or an NT file system (NTFS). In addition, when the operating system 3200 is a Unix/Linux-based system, the file system 3300 may be an extended file system (EXT), a Unix file system (UFS) or a journaling file system (JFS).

Referring to FIG. 37, the operating system 3200, the application 3100, and the file system 3300 in separate blocks is illustrated. However, the application 3100 and the file system 3300 may be included in the operating system 3200.

A translation layer 3400 may translate an address suitable for the memory device 3500 in response to a request from the file system 3300. For example, the translation layer 3400 may translate a logic address, which is generated by the file system 3300, into a physical address of the memory device 3500. Mapping information of the logic address and the physical address may be stored in an address translation table. For example, the translation layer 3400 may be a flash translation layer (FTL), a universal flash storage link layer (ULL), or the like.

The memory device 3500 may be a non-volatile memory and include the memory string described above with reference to FIGS. 1 to 33. The memory device 3500 may include a substrate in which a cell region and contact regions located at both sides of the cell region are defined; a first source layer formed over the substrate; a second source layer formed over the first source layer; a reinforcement pattern formed in the second source layer; a stacked structure including conductive layers and insulating layers alternately stacked over the second source layer and the reinforcement pattern; channel layers passing through the stacked structure and the second source layer and electrically coupled to the second source layer; and an isolation insulating pattern passing through at least one top conductive layer. Since the memory device 3500 is configured and manufactured in the same manner as the memory devices 1200, 1200' or 2100, a detailed description thereof will be omitted.

The computing system 3000 having the above-described configuration may be divided into an operating system layer operated in an upper layer region and a controller layer operated in a lower level region. The application 3100, the operating system 3200, and the file system 3300 may be included in the operating system layer and driven by an operation memory. The translation layer 3400 may be included in the operating system layer or the controller layer.

As described above, since the computing system 3000 according to an embodiment includes the memory device 3500 which has an improved degree of integration, it is easy to manufacture and has improved characteristics. Further, data storage capacity and characteristics of the computing system 3000 may also be improved.

According to an embodiment, a semiconductor device may include a reinforcement pattern formed in a source layer. Therefore, during processes of manufacturing a semiconductor device, structural stability may be increased, and manufacturing yield may be improved. In addition, a source layer electrically coupled to channel layers may be easily formed by using a protective layer.

What is claimed is:
1. A semiconductor device, comprising:
a substrate in which a cell region and contact regions, located at both sides of the cell region, are defined;
a first source layer formed over the substrate;
a second source layer formed over the first source layer;
a reinforcement pattern formed in the second source layer;
a stacked structure including conductive layers and insulating layers alternately stacked over the second source layer and the reinforcement pattern;
channel layers passing through the stacked structure and the second source layer and electrically coupled to the second source layer; and
an isolation insulating pattern passing through at least one top conductive layer of the conductive layers.
2. The semiconductor device of claim 1, wherein the isolation insulating pattern is located above and overlaps the reinforcement pattern.
3. The semiconductor device of claim 1, wherein the reinforcement pattern includes line patterns located above boundaries of the cell region and the contact regions.
4. The semiconductor device of claim 1, wherein the reinforcement pattern includes a line pattern located above the cell region or the contact regions.

5. The semiconductor device of claim 4, wherein the isolation insulating pattern overlaps the line pattern located in the cell region.

6. The semiconductor device of claim 1, wherein the reinforcement pattern includes island patterns located adjacent to a boundary between neighboring memory blocks.

7. The semiconductor device of claim 1, wherein the reinforcement pattern includes an insulating material.

8. The semiconductor device of claim 1, further comprising:
slit insulating layers passing through the stacked structure to contact the second source layer and not overlap the reinforcement pattern.

9. The semiconductor device of claim 1, further comprising:
memory layers interposed between the channel layers and the stacked structure.

10. The semiconductor device of claim 1, wherein the second source layer is formed on surfaces of the channel layers and a surface of the first source layer to define a concave portion in a surface of the second source layer.

11. The semiconductor device of claim 10, further comprising:
a slit insulating layer filling the concave portion of the second source layer.

12. The semiconductor device of claim 11, further comprising:
a gap formed in the slit insulating layer.

13. The semiconductor device of claim 1, further comprising:
a slit passing through the stacked structure;
a slit insulating layer formed on a sidewall of the slit, wherein a central portion of the slit is opened by the slit insulating layer; and
a common source line filling the central portion of the slit and contacting the second source layer.

14. The semiconductor device of claim 1, further comprising:
a data storage layer arranged between each of the channel layers and the stacked structure; and
an etch barrier layer formed between the reinforcement pattern and the stacked structure.

15. The semiconductor device of claim 14, wherein the etch barrier layer has a greater thickness than the data storage layer.

* * * * *